US005367248A

United States Patent [19]

Lin

[11] Patent Number: 5,367,248

[45] Date of Patent: Nov. 22, 1994

[54] METHOD AND APPARATUS FOR PRECISE MODULATION OF A REFERENCE CURRENT

[75] Inventor: San L. Lin, San Jose, Calif.

[73] Assignee: Winbond Electronics North America Corporation, San Jose, Calif.

[21] Appl. No.: 960,514

[22] Filed: Oct. 13, 1992

[51] Int. Cl.[5] .......................... G05F 3/20; H03K 3/01

[52] U.S. Cl. ...................................... 323/312; 363/73; 327/103; 327/530

[58] Field of Search ............... 323/312, 315, 316, 317; 363/73; 307/296.1, 296.6, 296.8

[56] References Cited

U.S. PATENT DOCUMENTS

| | | | |
|---|---|---|---|
| Re. 29,619 | 4/1978 | Pastoriza | 340/347 DA |
| 4,458,201 | 7/1984 | Koen | 323/317 |
| 4,461,991 | 7/1984 | Smith | 323/312 |
| 4,862,015 | 8/1989 | Grandfield | 307/270 |
| 4,999,567 | 3/1991 | Morigami | 323/315 |
| 5,054,890 | 10/1991 | Yoshikawa et al. | 323/315 |
| 5,223,743 | 6/1993 | Nakagawara | 307/296.1 |

FOREIGN PATENT DOCUMENTS

| | | | |
|---|---|---|---|
| 0147429 | 4/1981 | Germany | 323/312 |
| 0890381 | 12/1981 | U.S.S.R. | 323/312 |
| 1129533 | 12/1984 | U.S.S.R. | 323/312 |

OTHER PUBLICATIONS

Robert Amantea, "Voltage-to-current Converter", May 28, 1980, RCA Technical Notes, TN No. 1242.

*Primary Examiner*—Steven L. Stephan
*Assistant Examiner*—D. R. Haszko
*Attorney, Agent, or Firm*—Fliesler, Dubb, Meyer & Lovejoy

[57] ABSTRACT

The invention provides a method and apparatus for precise modulation of a reference current. A current generating apparatus in accordance with the invention is provided on an integrated circuit chip and includes a series connected chain comprising in the recited order: (a) an externally-set reference current source; (b) a current-to-voltage (I/V) converter for converting the reference current into an on-chip reference voltage, $V_{ref}$; (c) a voltage-to-current (V/I) converter for converting the reference voltage $V_{ref}$ into an on-chip, internal reference current $I_{iref}$; (d) a single-ended, voltage-operated current switch for modulating the internal reference current $I_{iref}$ to produce therefrom a modulated current signal, $I_M$; (e) a current-driven filter which receives the modulated current signal $I_M$ and produces therefrom a filtered voltage signal, $V_F$; (f) a voltage-to-current (V/I) converter for converting the filtered output voltage signal $V_F$ of the filter back into a current, $I_F$, and (g) a current multiplier for multiplying the magnitude of the current output by the V/I converter to thereby produce an output current, $I_{OUT}$.

35 Claims, 8 Drawing Sheets

IEEE RECOMMENDED DRIVER CURRENT SIGNAL LEVELS

METHOD AND APPARATUS FOR PRECISE MODULATION OF A REFERENCE CURRENT

BACKGROUND

1. Field of the Invention

The invention relates generally to conversion of a digital voltage signal into an analog current signal. The invention relates more specifically to an interface portion of a local area network (LAN) in which a current signal is to be generated in response to a digital voltage signal while satisfying prespecified current magnitude constraints and prespecified frequency constraints.

2. Description of the Related Art

Local area networks (LAN's) and wide area networks (WAN's) are becoming increasingly popular as a means for transferring data between spaced-apart data terminal equipment units (DTE's).

Standardized electrical interface requirements have to be complied with at points where different pieces of equipment (including those from different manufacturers) couple to a particular network. Conformity is necessary if signals output by one piece of equipment are to be appropriately received and understood by other pieces of equipment. Communication standards often specify certain voltage ranges and/or current ranges and/or impedance values which are to be maintained at each interface point. Waveshapes and timings are also commonly specified.

IEEE Standard 802.3 is representative of the type of interface standards found in commercial use. It defines a carrier sense multiple access with collision detection method. Ethernet is a popular LAN architecture which conforms to the IEEE 802.3 standard. An Ethernet network comprises a communications medium including a pair of wires (e.g., in twisted pair configuration or in a coaxial cable configuration) extending through a plurality of communication interface nodes.

Each Ethernet interface node includes a medium attachment unit (MAU) coupled directly to the two wires of the communication cable and an attachment unit interface (AUI) coupling the medium attachment unit (MAU) to local data terminal equipment (DTE).

A voltage-to-current, digital-to-analog waveform-shaping unit (hereafter, V/I:D/A unit) is provided within the medium attachment unit (MAU) at the point where the MAU connects to the communication cable. The V/I:D/A unit is supposed to receive a high-frequency digital voltage signal and in response, output a corresponding high-frequency analog current signal. The output current signal is then injected into the communication cable.

IEEE Standard 802.3 imposes a number of constraints on the current signal output by the V/I:D/A unit. The average DC magnitude of the output current must be in the range −37 milliamperes (mA) to −45 mA. The AC component of the output current must have at least a peak value of 28 mA, but the peak output current is not permitted to become positive. Additionally, the 10%-90% rise/fall time of the output current signal is specified as 25 ±5 nS (nanoseconds) when the data rate is 10Mb/s (megabits per second). Moreover, second and third harmonic components of the output current must be at least 20 dB below the fundamental component, fourth and fifth harmonics must be at least 30 dB below fundamental, sixth and seventh harmonics must be at least 40 dB below fundamental and all higher harmonics must be at least 50 dB below fundamental.

The IEEE 802.3 Standard specification suggests a frusto-triangular waveform for the output current. The suggested waveform peaks just below 0 mA, has an average value at −41 mA and a minimum value at −90 mA. (See FIG. 1C.)

Meeting the above IEEE 802.3 requirements and suggestions has proven difficult, particularly in cases where the V/I:D/A unit is to be mass produced.

One proposed design for a V/I:D/A unit comprises a plurality of series connected stages consisting in the recited order of: (1) a reference current source for generating a DC reference current, (2) a modulator for modulating the reference current with an externally supplied high-frequency, input voltage signal, (3) a current-to-voltage (I/V) converter for converting the modulated reference current into a modulated reference voltage, (4) a voltage-driven active filter for filtering the output voltage signal of the I/V converter, (5) a voltage-to-current (V/I) converter for converting a voltage output of the filter back into a current, and (6) a current multiplier for multiplying the magnitude of the current output by the V/I converter. (A block diagram of this proposed structure is shown in FIG. 1A.)

The proposed structure suffers from a number of drawbacks. Conventional active filters, such as that used in the fourth stage, inherently add an offset error to the signal that is being filtered. To maintain precision, in subsequent stages, a compensating offset is provided in the subsequent V/I converter (fifth stage) to assure that the final output current ($I_{OUT}$) complies with minimum, maximum and average current levels specified by IEEE 802.3.

Offset compensation in the V/I converter (fifth stage), however, distorts the frequency response of the overall V/I:D/A unit. The design of the active filter (fourth stage) needs to be adjusted to counteract the distortion. Precise adjustment is difficult to achieve in mass-production environments.

The offset compensation in the V/I converter (fifth stage) also adds delay into the series path through which the high-frequency input voltage signal travels. This affects the frequency and rise/fall time characteristics of the output current signal in a detrimental way.

The input source impedance of the conventional, voltage-driven active filter poses yet another design problem. The input source impedance shifts the location of design-specified poles and zeroes of the filter, making it difficult to precisely set them at desired points in the real/imaginary plane until the input source impedance is first specified.

In summary, it is difficult to mass produce systems which consistently meet IEEE 802.3 specifications by using the conventional offset-compensating design and the conventional voltage-driven active filter design.

SUMMARY OF THE INVENTION

The invention overcomes the above-mentioned problems by providing a method and apparatus for generating a controlled current from a supplied digital voltage signal.

One feature of the invention is the use of offset anticipation and pre-compensation (compensating upstream in the circuit, before the offset is introduced) rather than offset post-compensation (waiting for the offset to be introduced and doing something about it downstream in the circuit).

Another feature of the invention is the use of a current-driven filter rather than a voltage-driven filter.

A current generating apparatus in accordance with the invention is provided on an integrated circuit chip and includes a series connected chain comprising in the recited order of: (a) an externally-controlled reference current source for generating a first internal reference current; (b) a current-to-voltage (I/V) converter for converting the first internal reference current into an on-chip reference voltage, $V_{ref}$; (c) a voltage-to-current (V/I) converter for converting the reference voltage $V_{ref}$ into an on-chip, second internal reference current $I_{iref}$; (d) a single-ended, voltage-operated current switch for modulating the second internal reference current $I_{iref}$ to produce therefrom a modulated current signal, $I_M$; (e) a current-driven filter which receives the modulated current signal $I_M$ and produces therefrom a filtered voltage signal, $V_F$; (f) a voltage-to-current (V/I) converter for converting the filtered output voltage signal $V_F$ of the filter back into a current, $I_F$; and (g) a current multiplier for multiplying the magnitude of the current output by the V/I converter to thereby produce an output current, $I_{OUT}$, of a desired magnitude.

Yet another feature of the invention deals with selecting the magnitudes for the output current, $I_{OUT}$, such that the selected values provide significant leeway for mass-production variances while still meeting the IEEE 802.3 specification or a like specification.

A current generating method in accordance with the invention comprises the steps of: (a) applying an alternating input voltage signal having an average DC voltage level to a current modulator; (b) supplying a reference current to the current modulator; (c) defining a set of boundary conditions to be satisfied by an output current of the current modulator, given said average DC voltage level of the input voltage signal, said set of boundary conditions including an allowable range of minimum current magnitudes, $I_L$, for said output current and an allowable range of maximum current magnitudes, $I_H$, for said output current; and (d) operating the current modulator to produce minimum current magnitudes, $I_L$, which allow a relatively wide range of allowable maximum current magnitudes, $I_H$, for said output current.

BRIEF DESCRIPTION OF THE DRAWINGS

The below detailed description makes reference to the accompanying drawings, in which:

FIGS. 3A, 3B, and 3C combined to form a detailed schematic diagram of a V/I:D/A unit in accordance with the invention.

DETAILED DESCRIPTION

Figure 1A:
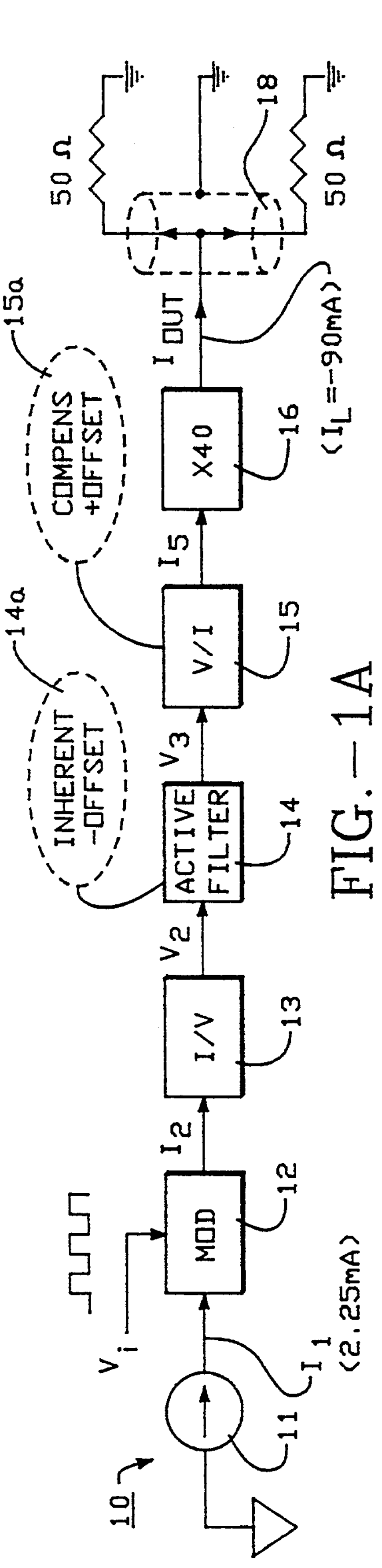
FIG. — 1A (PRIOR ART)
FIG. 1A is a block diagram of a previously proposed V/I:D/A unit.
Figure 1B:
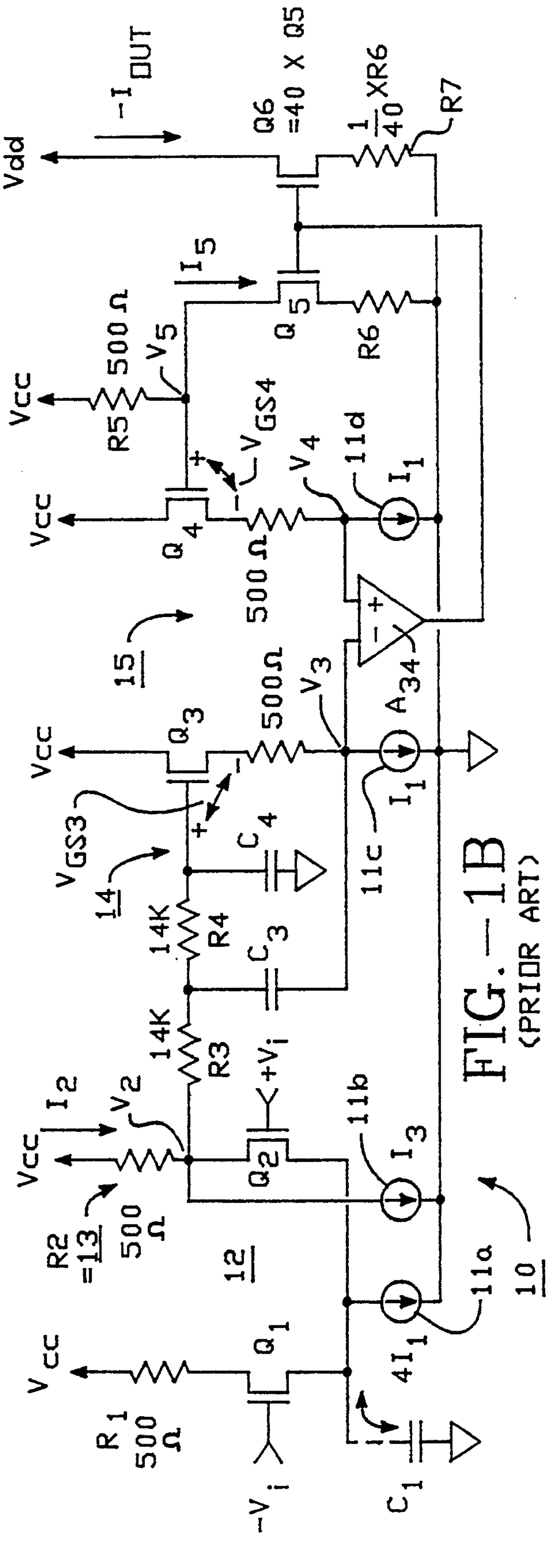
FIG. — 1B (PRIOR ART)
FIG. 1B is a detailed schematic of the previously proposed V/I:D/A unit of FIG. 1A.

FIG. 1A is a block diagram of a previously proposed V/I: D/A unit, 10. FIG. 1B is a detailed schematic of the same V/I:D/A unit 10. The drawbacks of this V/I:D/A unit 10 are discussed in depth so that advantages of a later disclosed V/I:D/A unit 20 (FIG. 2) will be readily appreciated.

In FIG. 1A, reference current source 11 generates a reference current $I_1$. Modulator 12 modulates the reference current $I_1$ in accordance with a high-frequency (e.g. 10 MHz) digital voltage signal, $V_i$, that is supplied to the modulator 12. A modulated current signal, $I_2$, is produced as the output of modulator 12. Current-to-voltage (I/V) converter 13 converts current $I_2$ to a corresponding voltage signal, $V_2$. Voltage signal $V_2$ is then applied to a voltage-driven active filter 14.

In area-efficient implementations of the V/I:D/A unit 10 (e.g., an implementations where most or all of the V/I:D/A unit is placed on a single integrated circuit chip with or without other circuits) the active filter 14 is often designed such that it has an inherent offset 14a. The offset 14a is accepted as a necessary penalty for minimizing the circuit area consumed by filter 14. Area-efficient active filter 14 accordingly produces an output voltage, $V_3$, which is a function of the received voltage, $V_2$, minus the filter-inherent offset 14a. This is expressed mathematically by the following equation, Eq. 1:

$$V_3 = f(V_2) - offset_{14a} \quad \text{(Eq. 1)}$$

where f() represents the transfer function of filter 14.

A voltage-to-current (V/I) converter 15 with a compensating offset 15a is used further downstream in the same V/I:D/A unit 10 to produce an output current of the form:

$$I_5 = g(V_3 + offset_{15a}) \quad \text{(Eq. 2)}$$

where g( ) represents the transfer function of the V/I converter 15. The g( ) transfer function includes an offset post-compensating subfunction which eliminates the negative $offset_{14a}$ inherent in transfer function f( ) of Eq. 1. The result can be loosely expressed as:

$$I_5 = g(f[V_2] - offset_{14a} + offset_{15a}) \quad \text{(Eq. 3)}$$

where functions, f() and g(), and the positive $offset_{15a}$ of V/I converter 15 are appropriately scaled so that the downstream-introduced positive $offset_{15a}$ cancels out the negative $offset_{14a}$ introduced upstream in circuit 10 by the area-efficient active filter 14.

Figure 1C:
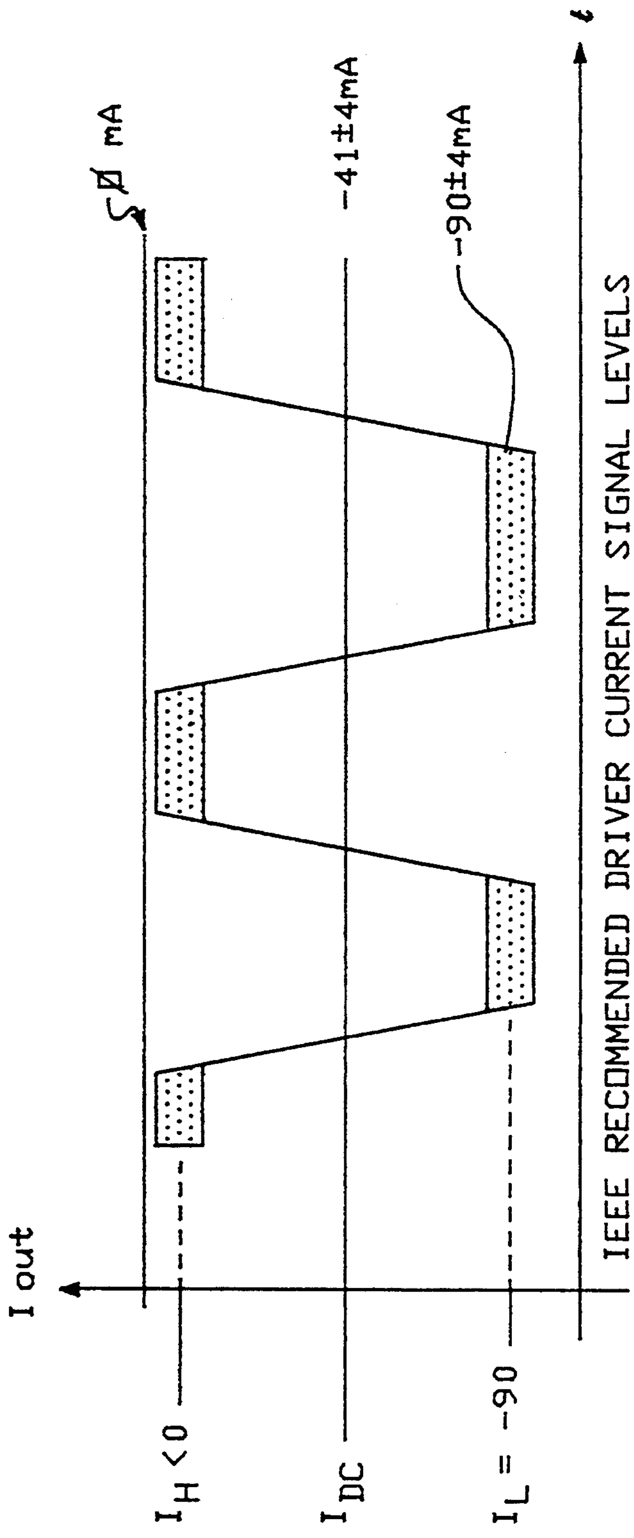
FIG.—1C (PRIOR ART)
FIG. 1C is a current versus time graph showing the output waveform previously proposed for a V/I:D/A unit.

The magnitude of current 15 is then multiplied by a scaling factor (e.g. 40 in this case) to produce a desired output current $I_{out}$, whose waveform is seen in FIG. 1C. A value of roughly negative 90 milliamperes (−90 mA) is typically specified as the most-negative or "low" limit, IL, for output current $I_{out}$.

The output current, $I_{out}$, is injected into communications cable 18. Cable 18 extends in opposed directions to couple halves of injected output current, $I_{out}$, to one or more signal receiving units (not shown). Cable 18 typically has a 50-ohm impedance. Ends of cable 18 are terminated with matching 50-ohm resistors.

A borderless, horizontally-hatched, triangle symbol is used in FIG. 1A and remaining figures of this specification to represent "cable ground." A closed, non-hatched, triangle symbol is used to represent "circuit ground." From an AC perspective, cable ground and circuit ground are the same. It is to be understood, however, that from a DC perspective, a prespecified DC offset voltage can exist between cable ground and circuit ground.

Referring to FIG. 1C, it is seen that the output current, $I_{out}$, has a frusto-triangular waveform peaking at a high level, $I_H$, which is just below zero milliamperes (e.g., $-8$ mA$<0$ mA), bottoming out at a low level, $I_L$, approximately 86 to 94 milliamperes (mA) below zero, and thereby defining a time-averaged DC value, $I_{DC}$, at approximately 37 to 45 milliamperes (mA) below zero.

FIG. 1B shows a previously proposed implementation of the V/I:D/A unit 10 of FIG. 1A in more detail. Reference generator 11 is formed of first and second constant-current generators, 11*a* and 11*b*. Constant-current generator 11*a* produces a current denoted as $4I_1$. Constant-current generator 11*b* produces a current denoted as $I_3$. The current magnitudes of respective generator 11*a* and 11*b* are set to produce a combined current of $4I_1+I_3=2.25$ mA. (Note that forty times negative 2.25 mA equals $-90$ mA and the latter is the median of the suggested $I_L$ range, $90\pm4$ mA.) The current magnitude of generator 11*b* sets the $I_H$ level and it is typically set to 0.2 mA. (Note that forty times negative 0.20 mA equals $-8$ mA for $I_H$ and the latter is calculated by assuming a 50% output duty cycle and median $-90$ mA and $-41$ mA values for $I_L$ and $I_{DC}$ respectively.)

Modulator 12 is formed of first and second matched N-channel transistors, Q1 and Q2. Each of the source terminals of Q1 and Q2 connects to constant current generator 11*a* (which sinks $4I_1$). The gate terminals of Q1 and Q2 respectively receive complementary digital voltage signals $-V_i$ and $+V_i$. The received input signals are Manchester encoded and operate at a nominal rate of 10 Megabits per second (10Mb/s).

The drain terminals of Q1 and Q2 respectively connect to first and second matched, 500-ohm pull-up resistors, $R_1$ and $R_2$. Resistors $R_1$ and $R_2$ connect to a constant $V_{cc}$ voltage supply. The drain of Q2 also connects to constant current generator 11*b* (which sinks $I_3$).

The 500-ohm resistor, $R_2$, which connects to the drain of Q2 defines the I/V converter 13. When current $I_2$ flows through transistor Q2, voltage $V_2$ develops at the drain-connected end of resistor $R_2$. ($V_2=V_{cc}-R_2(I_2)$.) $I_2$ equals $I_3$ in the case where Q2 is completely turned off. $I_2$ equals $4I_1+I_3$ in the case where Q2 is turned on and Q1 is completely turned off.

Modulator 12 (FIG. 1B) has the following drawback. A parasitic capacitance $C_1$ develops between AC ground and the source terminals of Q1 and Q2. This parasitic capacitance $C_1$ causes undesirable voltage spikes to develop in the output voltage $V_2$ of I/V converter 13. This complicates the design of filter 14.

Filter 14 (FIG. 1B) is formed of a third N-channel transistor, Q3, and an RC filter network which includes two series-connected 14-kilohm (14KΩ) resistors, $R_3$ and $R_4$. A corresponding pair of filter capacitors, $C_3$ and $C_4$ connect to $R_3$ and $R_4$. A 500-ohm resistor connects the source of Q3 to a third constant current source 11*c* that draws current $I_1$ (which is one fourth the current drawn by generator 11*a*).

A filter-output voltage, $V_3$, develops at the connection of third constant current source 11*c* to the 500-ohm resistor. For DC static conditions, the filter-output voltage, $V_3$, can be expressed as $V_3=V_2-V_{GS3}$, where $V_{GS3}$ is the gate-to-source offset voltage of transistor Q3. Capacitor $C_3$ feeds the filter-output voltage $V_3$ back to the node which connects $R_3$ to $R_4$. Capacitor $C_4$ connects between the gate of Q3 and circuit ground.

Aside from its inherent offset voltage, $V_{GS3}$, filter 14 suffers from the additional drawback that it is voltage driven. The Thevenin circuit equivalent of voltage supply $V_{cc}$ and current $I_2$ driving 500-ohm resistor $R_2$, is a $V_{cc}-I_2R_2$ voltage source which is series-coupled by second resistor $R_2$ to third resistor $R_3$. The Thevenin equivalent resistance of second resistor $R_2$ shifts the location of the poles and zeroes of filter 14 in the real/imaginary plane away from their resistance-free positions. The values of one or more of resistors, $R_3$ and $R_4$, and capacitors, $C_3$ and $C_4$, have to be adjusted to counteract this pole/zero location shift.

Offset compensating V/I converter 15 (FIG. 1B) is formed of a fourth N-channel transistor, Q4, which is matched to Q3, and an operational amplifier, $A_{34}$, which is feedback connected to drive fourth N-channel transistor Q4 to a state matching that of third transistor Q3. A fourth constant current source 11*d* draws current $I_1$ through Q4 and its 500-ohm source resistor, thereby developing voltage $V_4$ at the juncture of that source resistor and current source 11*d*.

The negative and positive input terminals of amplifier $A_{34}$ respectively receive $V_3$ and $V_4$. The output of amplifier $A_{34}$ drives the gate of fifth N-channel transistor Q5. Ideally, amplifier $A_{34}$ should have an input offset of zero volts so that $V_4$ will match exactly with $V_3$. Amplifier $A_{34}$ should also include feedback compensating means for preventing instability. A 500-ohm resistor $R_5$ connects the drain of Q5 to $V_{cc}$, Resistor $R_6$ connects the source of Q5 to circuit ground.

Under static DC conditions, when voltage $V_4$ develops near the source of Q4, a corresponding offset-compensated voltage, $V_5=V_4+V_{GS4}$, develops at the drain of Q5. Resistor $R_5$ converts voltage $V_5$ into current $I_5$.

The offset compensating V/I converter 15 (FIG. 1B) suffers from the drawback that amplifier $A_{34}$ has to be designed with sufficiently high bandwidth and small input offset to cause $V_4$ to accurately track $V_3$. This is difficult when $V_3$ itself has a relatively wide bandwidth and small magnitude.

Ideally, when $V_5=V_2$ for DC conditions, circuit symmetry will drive $I_5$ equal to $4I_1+I_3=2.25$ mA. Sixth transistor Q6 is provided with a channel width 40 times larger than that of Q5. The drain of Q6 connects to cable ground voltage $V_{dd}$ by way of the cable terminating resistors (shown in FIG. 1A). Cable ground voltage $V_{dd}$ is positive relative to circuit ground. The gate of Q6 connects to the gate of Q5.

A resistor $R_7$ having a resistance equal to one fortieth the resistance of $R_6$ connects the source of Q6 to circuit ground. Q6 is matched to Q5 and scaled to have a channel width that is forty-times as large. R7 is matched to R6 and, as already mentioned, scaled to have a resistance that is one fortieth that of R6. Due to current mirroring and scaling, the drain-to-source current of Q6, which defined as negative output current, $-I_{OUT}$, should be equal to 40 times $I_5$.

In summary, the V/I:D/A unit 10 of FIGS. 1A and 1B suffers from a number of drawbacks, including design complexity (especially in the design of filter 14), susceptibility to noise (especially in the operation of modulator 12), and a requirement for an operational amplifier ($A_{34}$) with exceptional characteristics. These problems become acute when mass production of the V/I:D/A unit 10 is contemplated. Minor production variations can easily move the characteristics of output current $I_{OUT}$ outside of the IEEE-specified bounds.

Figure 2:
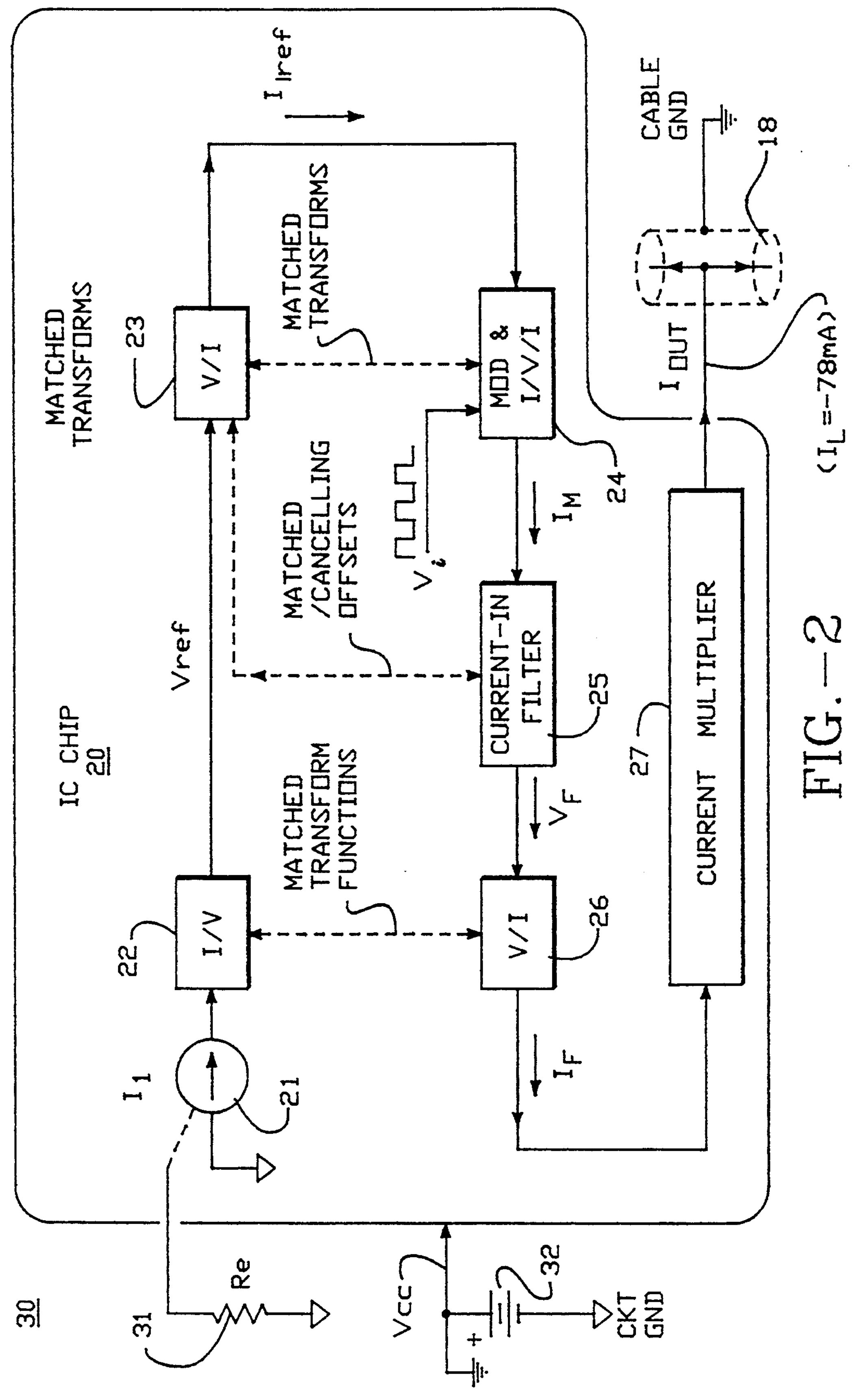
FIG. 2 is a block diagram of a V/I:D/A unit in accordance with the invention.

FIG. 2 is a block diagram of a V/I:D/A unit 30 (a digital-to-analog waveform-shaping unit) in accordance with the invention. Unit 30 comprises an integrated circuit (IC) chip 20 fabricated with complementary metal-oxide-semiconductor (CMOS) technology, an off-chip reference resistor $R_e$ (31), and an off-chip power supply 32 for supplying constant voltage $V_{cc}$ to IC chip 20. In the illustrated configuration, the negative (−) terminal of Vcc power supply 32 connects to "circuit" ground and the positive (+) terminal of Vcc power supply 32 connects to "cable" ground.

IC chip 20 includes a series connected chain comprising of:

(a) a variable reference current source 21 for generating a first reference current $I_1$ whose magnitude is controlled by the resistance of off-chip resistor $R_e$ (31);

(b) a current-to-voltage (I/V) converter 22 for converting the first reference current $I_1$ into an onchip reference voltage, $V_{ref}$;

(c) a voltage-to-current (V/I) converter 23 for converting the reference voltage $V_{ref}$ into an internal second reference current, $I_{iref}$;

(d) a single-ended, voltage-operated current switch 24 for modulating the internal second reference current $I_{iref}$ to produce therefrom a modulated current, $I_M$, where the current switch 24 provides a current-to-voltage-to-current transform function designated as "I/V/I";

(e) a current-driven filter 25 which receives the modulated current $I_M$ and produces therefrom a filtered output voltage signal, $V_F$;

(f) a voltage-to-current (V/I) converter 26 for converting the filtered output voltage signal $V_F$ of the filter back into a current, $I_F$, and (g) a current multiplier 27 for multiplying the magnitude of the current $I_F$ that is output by the V/I converter to thereby produce output current $I_{OUT}$.

In one embodiment of the invention, units 26 and 27 are combined into a single means which performs the V/I and current scaling functions simultaneously.

A number of important characteristics of V/I:D/A unit 30 are to be noted at the outset.

First of all, the I/V and V/I transform functions of units 22 and 26 are matched to one another. The V/I and I/V transform functions of units 23 and 24 are matched to one another.

Second, voltage-to-current (V/I) converter 23 introduces an upstream offset which anticipates and matches a downstream offset later introduced into the signal path by filter 25. The upstream offset introduced by V/I converter 23 cancels out the downstream offset introduced into the signal path by filter 25.

Third, filter 25 is current driven rather than voltage driven.

Fourth, a relatively small portion 24–27 of the overall series chain 21–27 carries signals that include the high-frequency input voltage $V_i$ or a high-frequency signal component derived from input voltage $V_i$.

Fifth, the low level $I_L$ of the output current $I_{OUT}$ is preferably set at approximately −69 mA to −82 mA. (Note: later it will be shown that this provides a variance tolerance which is 50% of a realizable maximum.) The low level $I_L$ of the output current $I_{OUT}$ is more preferably set at approximately −73 mA to −74 mA. (Note: later it will be shown that this provides a variance tolerance which is 100% of a realizable maximum.) These preferred and more preferred ranges are significantly different from the −90±4 mA range recommended by the IEEE 802.3 Standard specification.

The advantage of introducing an offset within the upstream-positioned voltage-to-current (V/I) converter 23 to anticipate, match and cancel out ahead of time an offset later introduced into the signal path by downstream-positioned filter 25 is that offset cancellation begins outside of the high-frequency path of the $V_i$ signal. The design of the further downstream voltage-to-current (V/I) converter 26 is simplified by the fact that the design does not need to take care of offset compensation. In particular, the design of V/I converter 26 can avoid use of an operational amplifier for performing after-the-fact offset compensation because the more upstream offset-compensating action of V/I converter 23 takes care of the offset problem. If this did not happen, an operational amplifier with exceptional high-frequency characteristics, such as the $A_{34}$ amplifier used in unit 15 of FIG. 1B, would have to be provided within the design of V/I converter 26.

The advantage of forming filter 25 as a current driven rather than voltage driven filter is that its Thevenin equivalent input resistance is reduced to zero and its poles and zeroes can be therefore set independently of circuit parameters found in current switch 24. In a preferred embodiment, input voltage $V_i$ is shaped as a square wave with 50% duty cycle and filter 25 is designed to have a pair of split poles set at 14 MHz thereby providing −3 dB gain at that frequency. The −3 dB gain point at 14 MHz yield the IEEE specified 25 nS rise/fall time in accordance with the formula, $0.35/t_{rise}=f_{-3db}$. The dual poles provide a 40 dB per decade roll off below the −3 dB point to meet the harmonic content requirements of the IEEE 802.3 standard.

The advantage of forming current switch 24 as a single-ended, voltage-operated unit is that it can be formed with simpler circuitry than that used for forming unit 12 in FIG. 1B and it does not suffer from the switching noise problems of unit 12.

The advantage of setting the low level $I_L$ of the output current $I_{OUT}$ above the −90±4 mA range recommended by the IEEE 802.3 Standard Manual is that it then becomes easier to conform with other signal-characteristic bounds set forth by the standard. It will be seen later that the recommended −90 mA $I_L$ level is at the border of a region which defines conforming modes of operation. Small variances can shift the state of the system from its border position to undesirable positions outside the allowed region of operation. The preferred −69 mA to −82 mA range and more preferred −73 mA to −74 mA range that are disclosed here for $I_L$ are located centrally within the region of conforming modes of operation, and are thus more tolerant of deviations and better suited for mass-production environments.

Figure 3A:
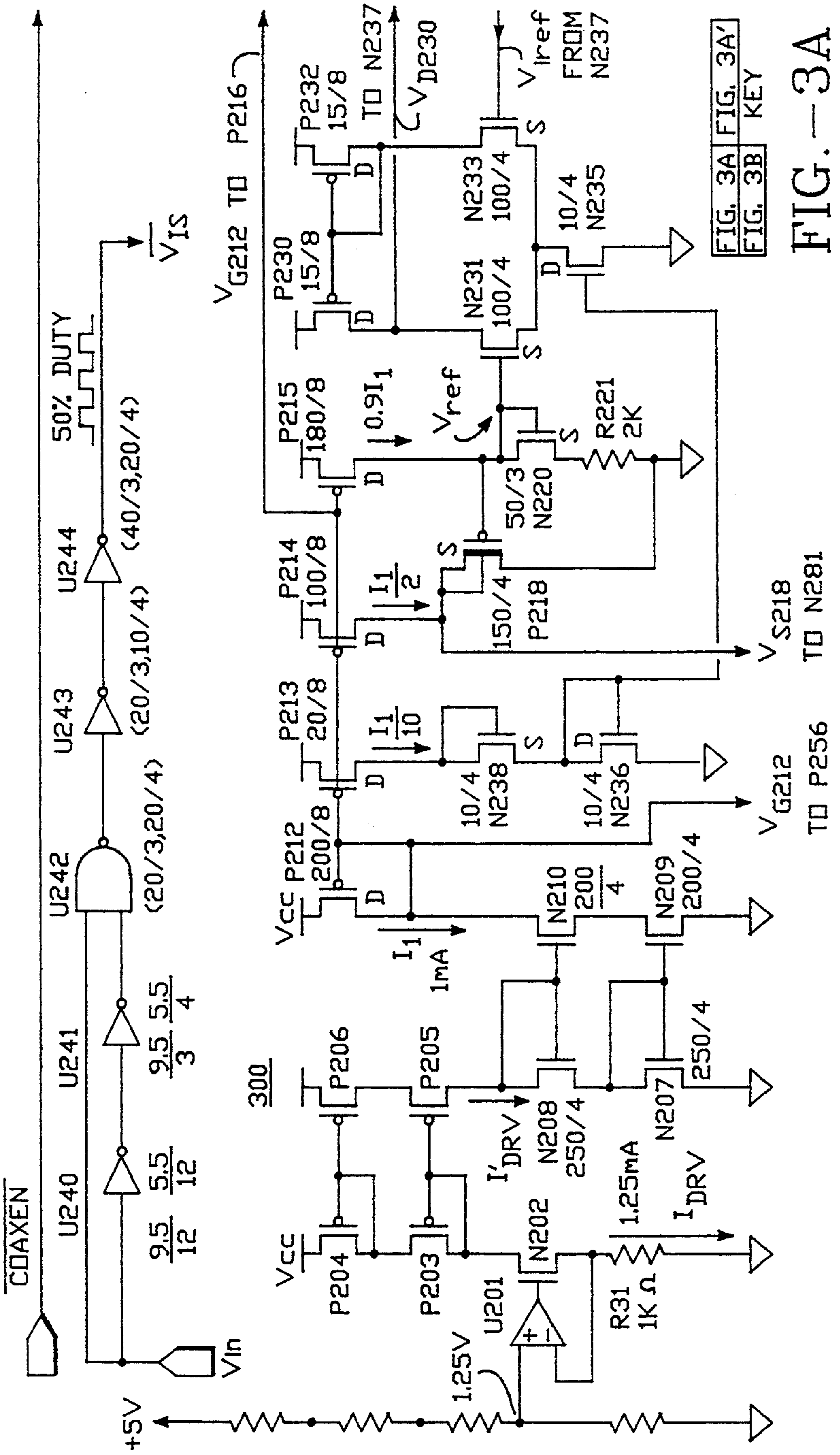
Figure 3A:
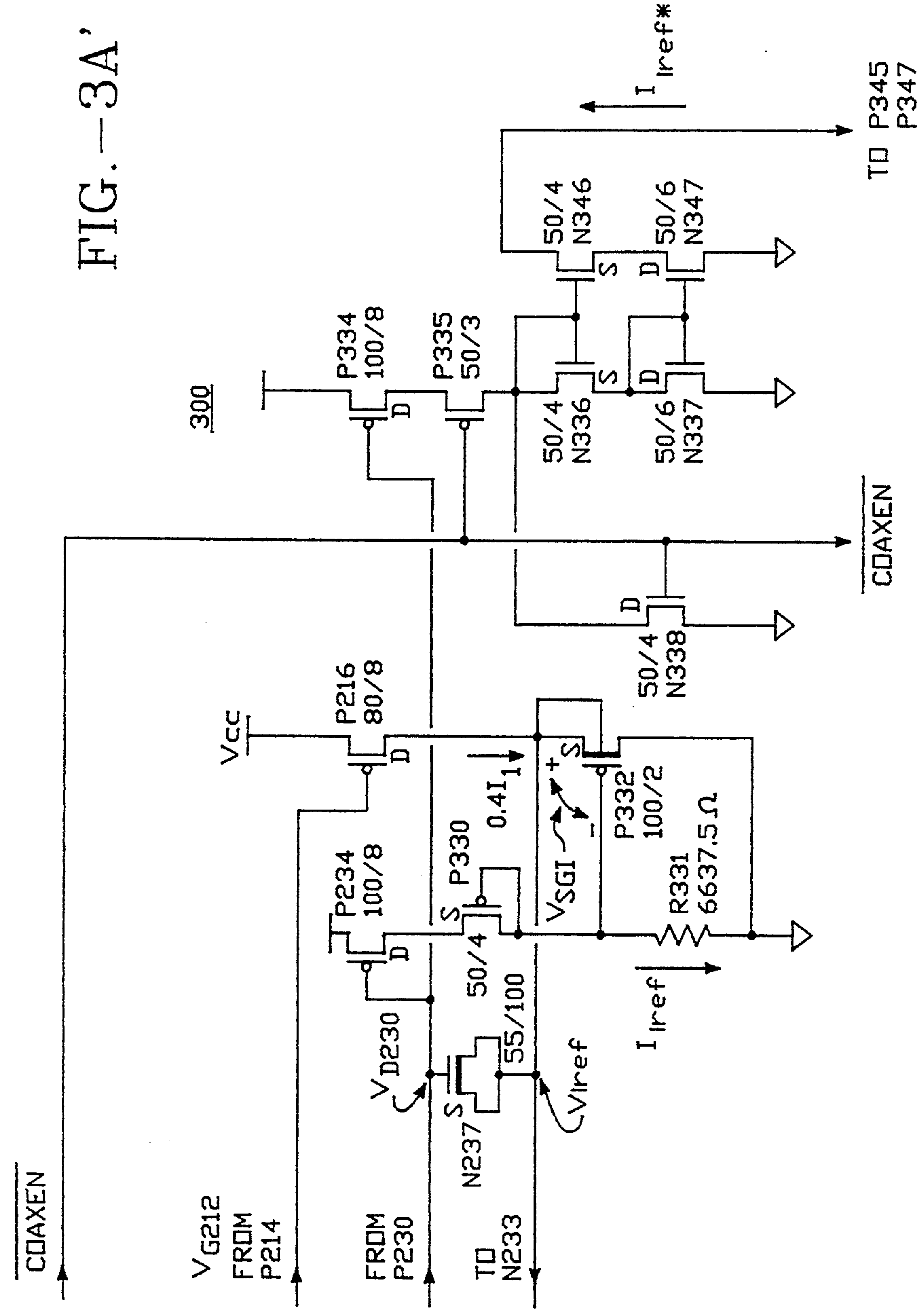
Figure 3B:
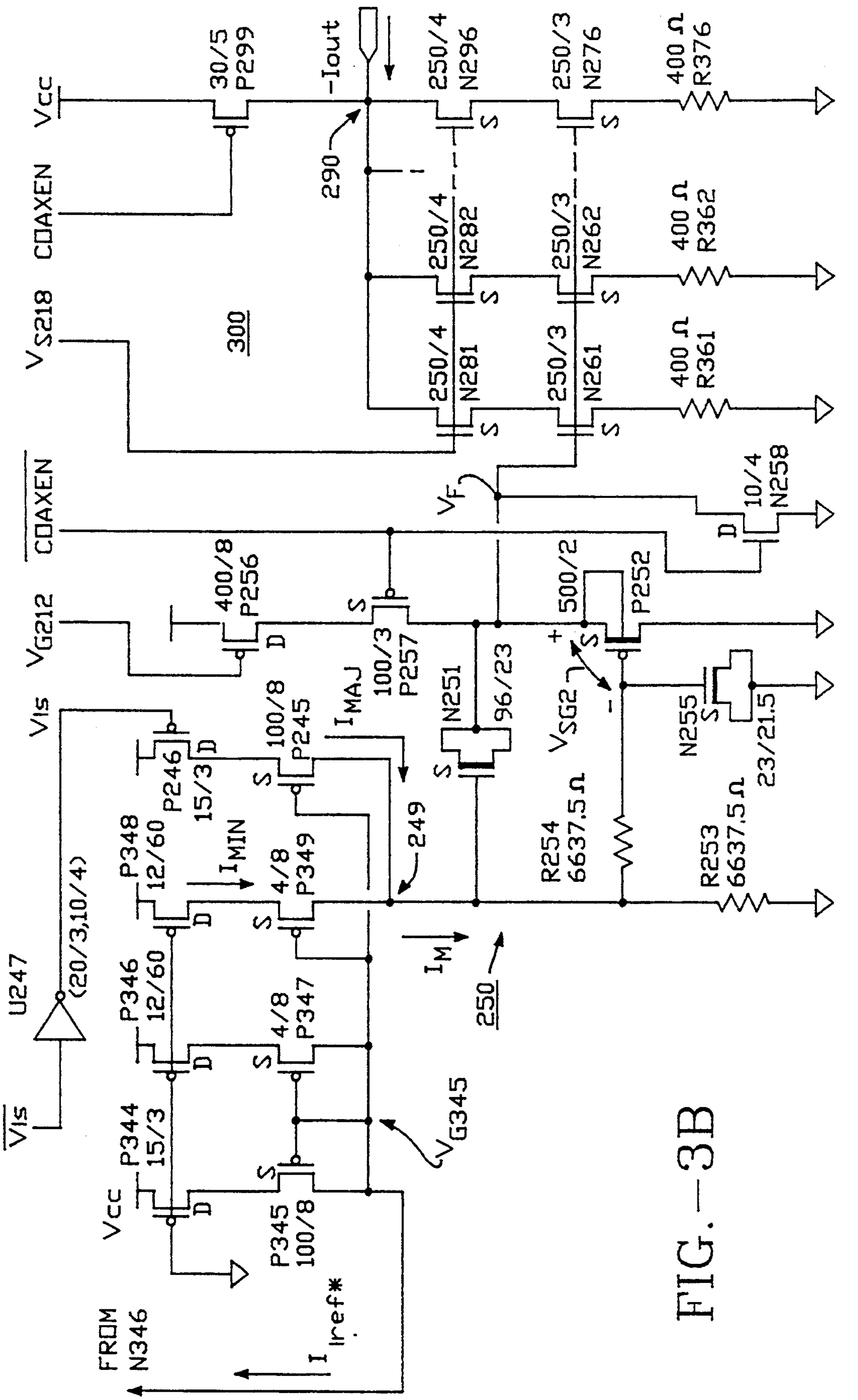

Referring to FIGS. 3A–3C, a preferred IC chip circuit design 300 in accordance with the invention will be described. Like reference symbols are used where possible for elements of FIGS. 3A-3C which correspond to but are not necessarily the same a those of FIG. 2. Elements "N210" through "N219" for example, form parts of a reference current unit corresponding to unit 21 of FIG. 2. Elements "N220" and "R221" form parts of a reference voltage generating unit corresponding to unit 22 of FIG. 2, and so on.

The letters "P" and "N" are respectively used at the front of each reference symbol in FIGS. 3A–3C to designate enhancement mode P-channel and N-channel MOS field effect transistors. Size designations shown next to each transistor represent channel width over channel length in microns. (Channel length is the distance between the source and drain portions of the transistor. Gate area is defined as including the product of the channel length multiplied by the channel width.) In places where a transistor gate is used to define a capacitor, capacitance is given in picofarads unless otherwise stated.

The letter "U" is used at the front of each reference symbol in FIGS. 3A–3C to designate a logic unit (e.g., inverter) comprising a P and N transistor. In such a case two ratios are given to designate device dimensions. The left ratio next to each logic unit symbol, Unnn, represents the channel width/length dimensions (in microns) of an internal P-channel transistor. The right ratio next to each logic unit symbol, Unnn, similarly represents the size of its internal N-channel transistor.

The letter "R" is used at the front of each reference symbol in FIGS. 3A–3C to designate a resistor. Resistance is given in units of ohms (Ω), or where otherwise designated, kilohms (KΩ). Except for resistor R31, all other resistors are on-chip and they are defined by integrated circuit fabricating processes (many well known in the art) to provide close matching of resistance versus temperature and process variations. All transistors of FIGS. 3A–3C are also on-chip and their characteristics are similarly matched with respect to temperature and process variations.

In FIG. 3A, operational amplifier U201 is connected in a negative feedback loop to drive the gate of transistor N202 so as to produce a specified voltage drop (e.g., 1.25 volts) across off-chip reference resistor R31 (e.g., 1KΩ). The specified voltage (e.g., 1.25 volts) can be generated in a number of ways including the illustrated resistive divider which produces a level equal to one quarter of a supplied ±5V reference. An alternative approach uses band-gap devices (e.g., a series of two forward biased silicon diodes) to produce the specified voltage (e.g., 1.25 volts).

Resistor R31 connects between the source of transistor N202 and circuit ground. Preferably, resistor R31 is provided off-chip so that users can adjust its resistance value and precision tolerance as desired. A drive current, $I_{DRV}$, (e.g., of 1.25 mA) flows from supply voltage Vcc, through the off-chip reference resistor R31 (e.g., 1KΩ), to circuit ground as a result of the voltage drop developed across R31. Drive current $I_{DRV}$ flows also through transistors P203 and P204, which are series connected between the drain of transistor N202 and supply voltage Vcc. Transistors P203 and P204 are each diode connected. (The gate of each respective transistor is connected to its drain).

Current mirroring replicates the drive current, $I_{DRV}'$, (e.g., of 1.25 mA) through series-connected transistors P205 and P206. (P205 and P206 are matched to P203 and P204. The gates of P205 and P206 connect to respective gates of P203 and P204. The source of P206 connects to supply voltage Vcc. ) The replicated drive current, $I_{DRV}'$, (e.g., of 1.25 mA) then flows to circuit ground through a further series of transistors, N208 and N207. Each of transistors N208 and N207 is diode connected. Each of transistors N208 and N207 has a width/length size of 250/4.

Additional current mirroring and scaling creates a scaled replica, $I_1$ (e.g. , of 1.00 mA) of the drive current $I_{DRV}'$ (e.g. , of 1.25 mA) . Replica current $I_1$ (which is also referred to as reference current $I_1$) flows through series-connected transistors N209 and N210. (N209 and N210 are matched to N207 and N208 but sized as 200/4 instead of 250/4. The gates of N209 and N210 connect to respective gates of N207 and N208. The source of N209 connects to circuit ground.) The replicated and scaled reference current, $I_1$ (e.g., of 1.00 mA), then flows to the circuit Vcc supply by way of a further transistor, P212, which is connected in series to the drain of N210. Transistor P212 (size =200/8) is diode-connected to generate voltage $V_{G212}$ at its gate.

Gate voltage $V_{G212}$ is applied to the gates of further transistors P213 (size =20/8), P214 (size =100/8) , P215 (size =180/8) , and P216 (size =80/8), to generate respective currents, $I_1/10$, $I_1/2$, $0.9I_1$, and $0.4I_1$ flowing through these transistors by way of current mirroring. Gate voltage $V_{G212}$ is also applied to another part of the circuit shown in FIG. 3C, as will be explained in due course. The sources of P212 through P216 connect to $V_{cc}$.

The drain of P215 connects to the drain of transistor N220 (size =50/3). The source of transistor N220 connects to grounded resistor R221 (2KΩ) thereby forming a series circuit from $V_{cc}$ to ground consisting of P215, N220 and R221. Transistor N220 is diode-connected (its source connects to its drain) to produce on-chip reference voltage $V_{ref}$ at the gate of N220.

Reference voltage $V_{ref}$ is applied to the gates of further transistors P218 (size =150/4) and N231 (size =100/4). The source of P218 connects to its own substrate and to the drain of P214. The drain of P218 connects to circuit ground. $V_{S218}$ represents the voltage developed at the source of P218. This voltage will be applied to another part of the circuit shown in FIG. 3C, as will be explained in due course. It is worthy to note now, however, that $V_{S218}$ is equal to a reference voltage, Vref, appearing at the gate of P218 plus the source to gate voltage drop of P218.

Transistor N233 (size =100/4) is matched and coupled to N231 (size =100/4) to reproduce the reference voltage $V_{ref}$ at the gate of N233. (The reproduced reference voltage is denoted as $V_{iref}$.) The source terminals of N231 and N233 both connect to the drain of transistor N235 (size =10/4). Transistor N235 functions as a constant current generator, drawing reference current $I_1/10$ from its drain to its grounded source. The gate of N235 connects to the gate of like-dimensioned transistor N236 (size =10/4). Transistor N236 is diode-connected as shown in FIG. 3A and receives the $I_1/10$ reference current from P213 by way of additional transistor N238 (size =10/4). Transistor N238 is also diode-connected.

Transistors P230 (size =15/8) and P232 (size =15/8) combine with N231, N233 and N235 to define a DC differential amplifier. This DC differential amplifier drives the voltage $V_{iref}$ at the gate of N233 equal to the reference voltage $V_{ref}$ present at the gates of N220 and N231. The drain of P230 connects to the drain of N231. The drain of P232 connects to the drain of N233. The source terminals of P230 and P232 connect to $V_{cc}$. P232 is diode-connected and its gate further couples to the gate of P230.

An output voltage $V_{D230}$ developed at the drain of P230 is applied to the gates of further transistors, P234 (size =100/8) , N237 (size =55/100) , and P334 (size =100/8). N237 has its source tied to its drain and to the gate of N233, thereby defining a stabilizing capacitor (5 pF) having ends coupled respectively to output voltage $V_{D230}$ and the reproduced, internal reference voltage, $V_{iref}$.

Output voltage $V_{D230}$ drives P234 to produce an internal (on-chip) reference current $I_{iref}$ flowing through P234, and through a diode-connected other transistor P330 (size =50/4), and through an on-chip reference resistor R331 (6637.5Ω). The drain of P330 connects to the gate of an offset-precompensating transistor P332 (size =100/2). The source of P332 connects to the substrate of P332 and to the gate of N233 and to the drain of P216.

A voltage drop which develops from the source of offset-precompensating transistor P332 to the gate of transistor P332 is referenced here as first offset voltage, $V_{SG1}$. The current $I_{iref}$ flowing through resistor R331 is then defined by the following equation:

$$I_{iref}=(V_{iref}-V_{SG1})/R331 \quad \text{(Eq. 4)}$$

Current mirroring is used to reproduce the internal reference current $I_{iref}$ in P334. (The same output voltage $V_{D230}$ that drives the gate of P234 also drives the gate of P334. P234 and P334 have their sources tied to $V_{cc}$.) Essentially the same reference current $I_{iref}$ then flows in sequence from the drain of P334 through transistor P335 (size =50/3), through transistor N336 (size =50/4), and through transistor N337 (size =50/6). An inverted coax-drive enable signal, $\overline{COAXEN}$, connects to the gate of P335. The inverted coax-drive enable signal, $\overline{COAXEN}$, also connects to the gate of another transistor N338 (size =10/4). The source of N338 is grounded. The drain of N338 connects to the drain of P335. When the inverted coax-drive enable signal, $\overline{COAXEN}$, is at logic low, N338 is turned off and a relatively small leakage current flows through it. If the inverted coax-drive enable signal, $\overline{COAXEN}$, is switched to logic high (true), N338 is turned on and current flowing out of the drain of P335 is diverted to ground, thereby cutting off current flow through N336 and N337. The inverted coax-drive enable signal, $\overline{COAXEN}$, is used for selectively enabling or disabling the V/I:D/A unit 300 to inject a current signal into its corresponding coaxial cable 18 (see FIG. 2).

Additional current mirroring is used to reproduce the current flowing through N336 and N337 in corresponding transistors N346 (size =50/4) and N347 (size =50/6). Transistors N336 and N337 are diode-connected. The gate of N346 connects to the gate of N336. The gate of N347 connects to the gate of N337. Current flowing through transistors N346 and N347 is denoted here as the enabled reference current, $I_{iref^*}$.

Referring to FIG. 3C, the enabled reference current, $I_{iref^*}$, is split such that a first, major part (25 twentysixths) thereof flows through further transistors P345 (size =100/8) and P344 (size =15/3) and such that a second, minor part (one twentysixth) thereof flows through further transistors P347 (size =4/8) and P346 (size =12/60). The sources of P344 and P346 connect to $V_{cc}$ and their gates connect to circuit ground. The gates of transistors P345 and P347 are connected to one another. Transistors P345 and P347 are each diode-connected to produce a voltage, $V_{G345}$, at their respective gates.

The gate voltage $V_{G345}$ of respective transistors P345 (size =100/8) and P347 (size =4/8) is applied to the gates of corresponding and matching transistors, P245 (size =100/8) and P349 (size =4/8). The source of P349 connects to the drain of further transistor P348 (size =12/60). The source of P245 connects to the drain of further transistor P246 (size =15/3). The sources of P348 and P246 connect to $V_{cc}$. The gate of P348 connects to circuit ground. The gate of P246 receives a square-shaped input voltage signal, $V_{IS}$, which will be described in more detail below.

The drains of transistors P349 and P245 connect to a current-summing node 249. When P246 is switched on (placed in a conductive state), the conditions of P349 and P245 match those of P347 and P345, and a combined current, $I_M=I_{MAJ}+I_{MIN}$, having the same magnitude as the enabled reference current, $I_{iref^*}$, flows through P349 and P245 into current-summing node 249. (This current flow corresponds to the most-negative, $I_L$ level of output current $I_{OUT}$.)

When P246 is switched off (placed in a nonconductive state), no current flows from P245 into current-summing node 249. Only a mirrored (1/26th) minor portion, $I_{MIN}$, of enabled reference current, $I_{iref^*}$, flows through P349 into current-summing node 249. (This current flow corresponds to the least-negative, $I_H$ level of output current $I_{OUT}$. Although explained in more detail later, it is worthwhile to note here that the "correspondence" between $I_{MIN}$ and $I_H$ is weaker than the "correspondence" between $I_{MAJ}$ and $I_L$.)

As mentioned above, transistor P246 receives a square-shaped input voltage signal, $V_{IS}$, at its gate. The square-shaped input voltage signal $V_{IS}$ is controlled to have a 50 percent duty cycle as follows. One input terminal of NAND gate U242 (shown in FIG. 3A with respective P and N sizes 20/3 and 20/4) receives a digital input voltage signal, $V_{IN}$, having a duty cycle other than 50%. A second input terminal of NAND gate U242 receives a time-delayed version of digital input voltage signal, $V_{IN}$. Inverters U240 (P-size =9.5/12, N-size =5.5/12) and U241 (P-size =9.5/3, N-size =5.5/4) are cascaded in series as shown and their signal propagation times are set by way of appropriate dimensioning or other fabrication-process control techniques to provide a time delay which causes the signal output by NAND gate U242 to have a 50% duty cycle. Inverters U243 (P-size =20/3, N-size =10/4), U244 (P-size =40/3, N-size =20/4), and U247 (FIG. 3C) (P-size =20/3, N-size =10/4) are cascaded in series as shown to amplify the output of NAND gate U242. The output of inverter U247 connects to the gate of P246 (FIG. 3C).

Current-summing node 249 produces a summed current, $I_M=I_{MAJ}+I_{MIN}$ or $I_M=O+I_{MIN}$ (depending on the on/off state of P246), which next flows through an input resistor R253 (6637.5Ω). Resistor R253 serves as the input current receiving means of a current-driven, source-follower filter 250. Resistor R253 is matched to resistor R331 (FIG. 3A) so that a voltage equal to $(I_{iref})\cdot$(R331) will develop across filter input resistor R253 when $I_M=I_{MAJ}+I_{MIN}=I_{iref}$.

Input resistor R253 defines part of an active RC filter 250. Active filter 250 further includes: a second resistor R254 (6637.5Ω); a first filter capacitor (2.8 pF) formed between the gate of transistor N251 (size =96/23) and the joined-together source and drain terminals of transistor N251; and a second filter capacitor (whose value is set to 1.09 pF minus the total parasatic capacitance present at the gate of P252) formed between the gate of transistor N255 (size =23/21.5) and the joined-together source and drain terminals of transistor N255. (Note: the capacitance of second filter capacitor N255 is set to define an effective capacitance of 1.09 pF at the gate of P252. 1.09 pF is one half the 2.18 picoFarad value of N251.)

The RC active filter 250 further includes a voltage follower stage formed by filter transistor P252 (size =500/2) and current sourcing transistors P256 (size =400/8) and P257 (size =100/3). Current sourcing transistors P256 and P257 are series connected between the source of filter transistor P252 and the Vcc voltage supply.

Second resistor R254 is interposed between filter input node 249 (also referred to as the current-summing node 249) and the gate of transistor P252. Capacitor N251 is interposed between filter input node 249 and the source of transistor P252. Capacitor N255 is interposed between the gate of transistor P252 and circuit ground. The drain of transistor P252 connects to ground. The substrate of transistor P252 connects to its source. A filter output voltage, $V_F$, develops at the source of filter transistor P252. A voltage drop which develops from the source of filter transistor P252 to the gate of transistor P252 is referenced here as second offset voltage, $V_{SG2}$.

Filter transistor P252 is sized five times wider than offset-precompensating transistor P332 (FIG. 3B). Transistor P256 (size =400/8) is sized five times wider than corresponding transistor P216 (FIG. 3B) and receives the same $V_{G212}$ voltage at its gate as does P216. Transistor P257 receives the inverted coax-drive enable signal, $\overline{\text{COAXEN}}$, at its gate. The inverted coaxdrive enable signal, $\overline{\text{COAXEN}}$, is also applied to the gate of another transistor N258 (size =10/4). The drain of N258 connects to the source of filter transistor P252, at the point where filter output voltage, $V_F$, develops. The source of N258 is tied to ground.

When $\overline{\text{COAXEN}}$is switched high (near Vcc), transistor N258 turns on (becomes conductive) and pulls the filter output voltage, $V_F$, to ground. At the same time, transistor P257 turns off (becomes nonconductive) and thereby opens the connection between the source of P252 and the drain of current sourcing transistor P256.

When $\overline{\text{COAXEN}}$is switched low (near ground) and filter input current $I_M$ is the same as internal reference current $I_{iref}$, the voltage and current conditions at filter transistor P252 (FIG. 3C) mimic those found at offset-precompensating transistor P332 (FIG. 3B). In such a case, the voltage drop, $V_{SG2}$, which develops from the source of filter transistor P252 to the gate of transistor P252 equals the first offset voltage, $V_{SG1}$, found between the source and gate of offset-precompensating transistor P332. ($V_{SG2}=V_{SG1}$.)

The filter output voltage $V_F$ which develops at the source of filter transistor P252 can be defined by the following equation:

$$V_F=I_M(R253)+V_{SG2} \quad \text{(Eq. 5)}$$

When the condition, $I_M=I_{iref}$, is met, filter output voltage $V_F$ equals internal reference voltage $V_{iref}$ and it also equals reference voltage $V_{ref}$.

As seen in FIG. 3C, filter output voltage $V_F$ is next applied to the gates of a set of sixteen transistors, N261 through N276, each of size 250/3. The source of each of transistors, N261 through N276, connects to a corresponding one of sixteen resistors, R361 through R376. Each of resistors R361-R376 has a resistance of 400 ohms.

Transistor N261 is sized five times wider than corresponding transistor N220 (FIG. 3A). The 400 ohms resistance of resistor R361 is equal to one fifth that of corresponding resistor R221 (2000 ohms). Due to current mirroring, a current having a magnitude equal to five times that flowing through N220 flows through transistor N261, when $V_F=V_{ref}$. The current flowing through N220 has a magnitude of $0.9I_1$. The corresponding current that flows through N261 and R361 accordingly has a magnitude of five times $0.9I_1$, or $4.5I_1$.

The same can be said for each of remaining transistors N262–N276 and their corresponding resistors R362–R376. The combined current flow through all sixteen transistors N261–N276 is equal to sixteen times $4.5I_1$, or $72I_1$. For the case of $I_1=1.25$ mA, the combined current flow of transistors N261–N276 will be 85 mA. (It will be seen shortly that this operating state is slightly outside of a preferred 69 mA to 82 mA range.) For the case of $I_1=1$ mA, the combined current flow of transistors N261–N276 will be 72 mA. (It will be seen shortly that this operating state is slightly outside of a more preferred 73 mA to 74 mA range.) External resistor R31 (FIG. 3A) preferably has its resistance adjusted to provide a combined current flow in N261–N276 of approximately 67 mA to 86 mA (which range provides 25% of an available variance tolerance that is explained below) and more preferably of 69 mA to 82 mA (which range provides 50% of the available variance tolerance) and even more preferably of 73 mA to 74 mA (which range provides 100% of the available variance tolerance).

As seen in FIG. 3C, the respective drains of transistors N261–N276 connect to the corresponding sources of transistors N281 through N296, where the latter transistors each have a size of 250/4. The respective drains of transistors N281–N296 connect to a current-summing node 290 which is provided for drawing the output current, $-I_{OUT}$, from the communications cable 18 (see FIG. 2) as indicated in FIG. 3C.

Additionally, transistor P299 (size =30/5) is provided with its source coupled to current-summing node 290 and its drain connected to $V_{cc}$. A non-inverted version of the coax-drive enable signal, COAXEN, is applied to the gate of P299. When COAXEN is high (near $V_{cc}$), P299 is turned off, thereby allowing transistors N281–N296 to draw current $-I_{OUT}$ from the attached communication cable. (Current $-I_{OUT}$ develops because the opposed ends of the communication cable connect to cable ground by way of the 50 ohm terminating resistors shown in FIG. 1A. Cable ground is positive relative to the circuit ground of FIG. 3C.)

When COAXEN is low (near ground), P299 is turned on to impress a voltage of approximately $V_{cc}$ onto the attached communication cable 18 (not shown in FIG. 3C).

The voltage $V_{S218}$ which develops at the source of P218 (FIG. 3A) is coupled to the gates of respective transistors N281–N296. As already explained, voltage $V_{S218}$ is equal to $V_{ref}$ plus $V_{SG218}$. $V_{SG218}$ is the source-to-gate voltage that develops at P218 and it is roughly equal to one volt.

Under the condition where $I_M=I_{MAJ}+I_{MIN}=I_{iref}$, the maximum level reached by filter output voltage $V_F$ is substantially equal to $V_{ref}$. Gate voltage $V_{S218}$ is approximately equal to $V_{ref}+1.0$. This level of $V_{S218}$ is sufficiently above the maximum level reached by $V_F$ to ensure that the resulting source voltages of N281–N296 (size =250/4) will be high enough so that a sufficiently large drain-to-source voltage ($V_{DS}$) will develop across each of transistors N261–N276 (size =250/3) to support the corresponding $4.5I_1$ current flow. If we assume that N261–N276 have a same gate-to-source voltage ($V_{GS}$) as the $V_{GS}$ of N281–N296, then the gate voltage $V_{S218}$ should be at least one drain-saturation voltage ($V_{DSAT}$) above the maximum level reached by filter output voltage $V_F$. ($V_{DSAT}$ is typically a few hundred millivolts, which is substantially less than 1.0 volt.) Each of transistors N281-N296 functions as a relatively large impedance separating output node (current-summing node) 290 from AC ground.

The large signal transconductance, $G_m$, of combined transistors N261-N276 can be defined by the following equation:

$$G_m = I_{OUT}/(V_F - V_{th}) \quad \text{(Eq. 6)}$$

where $V_{th}$ represents the threshold voltage of the transistors. The large signal transconductance, $G_m$, of combined transistors N261–N276 relates to their small signal transconductance, $g_m$, as defined by the following approximating equation:

$$G_m = 1/(R + 2/g_m) \quad \text{(Eq. 7);}$$

where R represents the resistance of resistors R361–R376. The small signal transconductance, $g_m$, tends to vary with current. It is desirable to maintain a fairly linear large signal transconductance, $G_m$, however. To do so, the factor $2/g_m$ should be set relatively small in comparison to R. This is preferably done in the circuitry of V/I:D/A unit 300 by choosing a relatively large absolute value for current level $I_H$ and a relatively large value for resistors R361–R376.

Filter circuit 250 (FIG. 3C) is worthy of some additional notes. If a worst case condition is assumed where the Manchester-encoded modulating-voltage $V_{IS}$ maintains a square wave profile with a 50% duty cycle over a prolonged time period (which means that it is operating at its maximum frequency), the waveform of the corresponding filter-input current, $I_M$, can be decomposed by Fourier analysis into a series of odd harmonics. The decomposition may be expressed by below Eq. 8, in which, $\omega$ represents the fundamental frequency in radians per second, $I_{Mmax}$ represents the peak magnitude of the AC signal component and $I_{Mdc}$ represents the DC component.

$$I_M(t) = I_{Mmax}\left(1 \cdot \sin(1 \cdot \omega t) + \frac{1}{3} \cdot \sin(3 \cdot \omega t) + \frac{1}{5} \cdot \sin(5 \cdot \omega t) + \frac{1}{7} \cdot \sin(7 \cdot \omega t) + \ldots\right) + I_{Mdc} \quad \text{(Eq. 8)}$$

To obtain the desired 20 dB suppression of 3rd harmonics, 30 dB suppression of 5th harmonics, 40 dB suppression of 7th harmonics, and 50 dB or greater suppression of higher harmonics, as set forth by IEEE 802.3; filter 250 should be designed to provide 9.5 dB of additional suppression at the frequency of the 3rd harmonic, 13.9 dB of additional suppression at the frequency of the 5th harmonic, 16.9 dB of additional suppression at the frequency of the 7th harmonic, and 19 dB of additional suppression at the frequency of the 9th harmonic.

For a worst case scenario in which the fundamental is at 10 MHz and the −3 dB point of the filter is placed at 14 MHz, a two pole design (with a 40 dB per decade drop-off) should provide sufficient suppression of 3rd and higher harmonics to produce the desired harmonic suppression in the output signal, $-I_{OUT}$. The poles are preferably split and placed at 14 MHz to provide the desired −3 dB point at 14 MHz (Q=0.707).

Because the equivalent current source at filter input node 249 has virtually no input impedance associated with it, the design of filter 250 is relatively straightforward:

When the resistance of R253 equals that of R254, the relationships for $\omega_0$ and Q become:

$$\omega_0 = \frac{1}{(R253)(C251)}\sqrt{\frac{C251}{C255}} = (2\pi)\ 14\ \text{M rad/sec}$$

$$Q = \frac{1}{2}\sqrt{\frac{C251}{C255}} = .707$$

where C251 represents the gate capacitance of transistor N251, and C255 represents the total gate capacitance of transistors N255 and P252.

Figure 4:
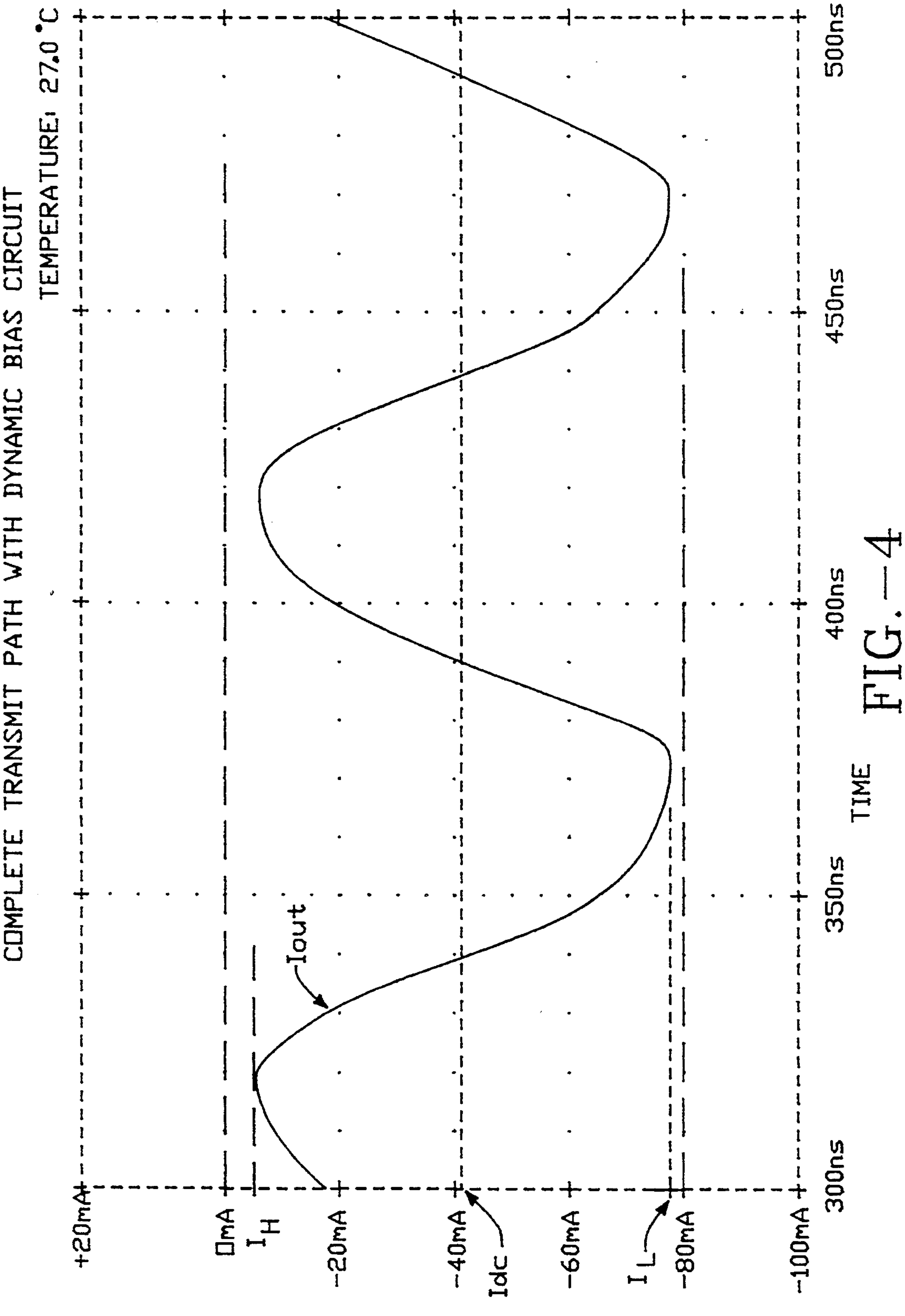
FIG. 4 is a current versus time plot of an output signal in accordance with the invention.

FIG. 4 shows a current (mA) versus time (nanoseconds) plot of $I_{OUT}$ as generated by a well known computer simulation program, SPICE, for the above design. (Simulation assumed temperature is 27° C. and input rate is 10Mb/s.) Note that the output is nearly sinusoidal in waveshape, peaking at approximately $I_H = -5$ mA and bottoming out at approximately $I_L = -78$ mA. The average current is $I_{DC} = (I_H + I_L)/2 = -41.5$ mA. The peak AC component is $I_{AC} = (I_H - I_L)/2 = 36.5$ mA. This is quite different from the IEEE suggested waveform of FIG. 1C.

Figure 5:
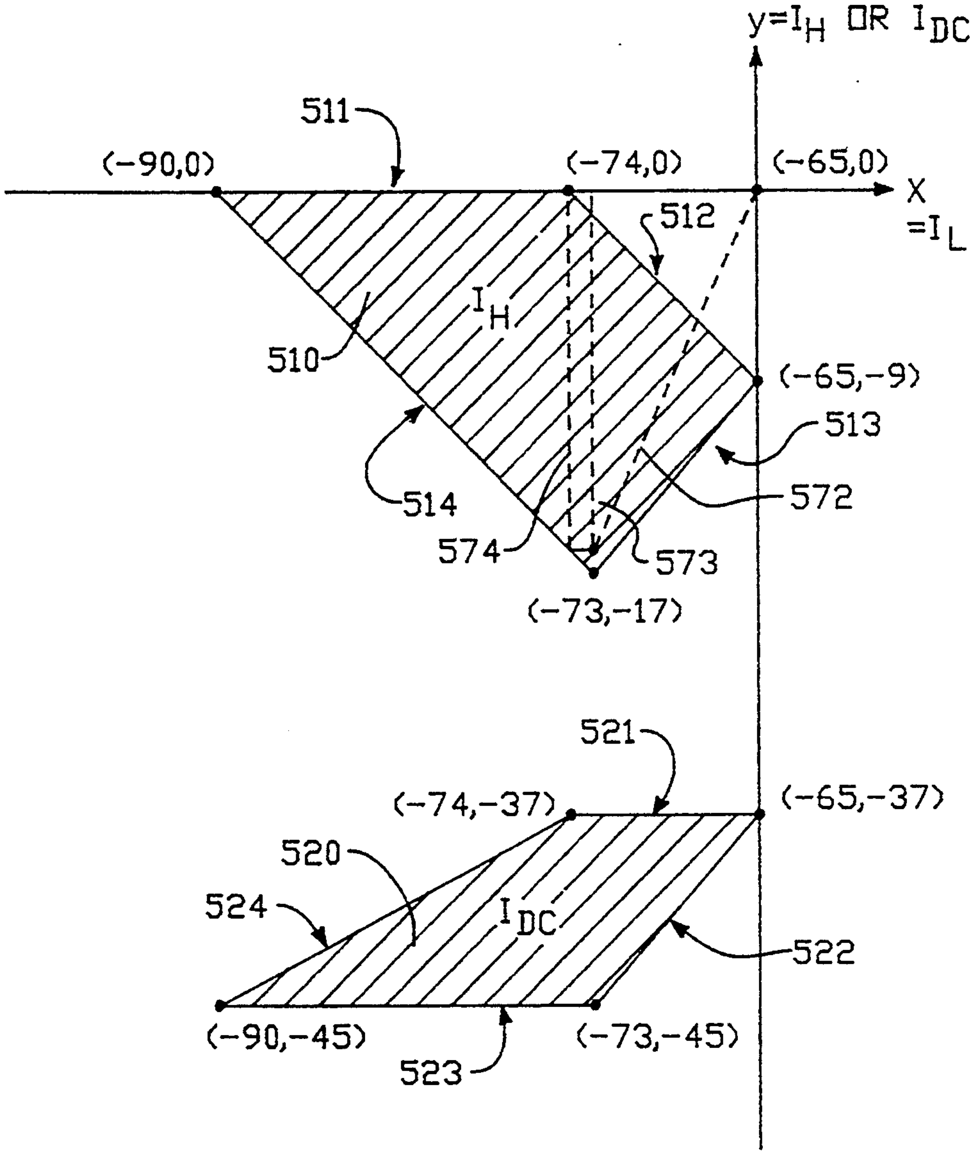
FIG. 5 is a boundary chart showing allowed modes of operation in accordance with the invention.

FIG. 5 is a boundary diagram showing the allowed regions of operation if a 50% duty cycle is assumed. The x-axis (horizontal axis) represents possible settings in milliamperes for the bottom current level, $I_L$, of FIG. 4. The y-axis (vertical axis) represents possible settings in milliamperes for the both the peak current level, $I_H$, and the time-averaged (DC) current level, $I_{DC}$, of FIG. 4.

When referencing FIG. 5, it is to be understood that although $I_L$ is referred to as the "bottom" or "lowest" level of always-negative $I_{OUT}$, in terms of absolute numbers $I_L$ is really the maximum absolute magnitude of the output current, $I_{OUT}$. Even though $I_H$ is referred to as the "top" or "highest" level of always-negative $I_{OUT}$, in terms of absolute values $I_H$ is really the minimum absolute magnitude of $I_{OUT}$. FIG. 5 can be converted into a positive $I_{OUT}$ counterpart by mirroring quadrant 3 (negative X and negative Y) into quadrant 1 (positive X and positive Y).

Shaded polygon 510 represents possible modes of operation for $I_H$ versus $I_L$. Shaded polygon 520 represents possible modes of operation for $I_{DC}$ versus $I_L$. Polygon 510 has the following four (x,y) corner coordinates: (−74,0), (−90,0), (−73,−17) and (−65,−9). Polygon 520 has the following four (x,y) corner coordinates: (−65,−37), (−74,−37), (−90,−45) and (−73 ,−45).

The boundaries of polygon 510 are derived as follows. Top boundary 511 is defined from the relation: $I_H \leqq 0$. Top right boundary 512 is defined from the relation: $I_H \leqq -I_L - (2\times37) = -I_L - (74)$. The relation for boundary 512 arises from the initial assumption that the duty cycle is 50% and thus the maximum value for $I_{DC}$ is given by $(I_H + I_L)/2 \leqq -37$ mA. Bottom right boundary 513 is defined from the relation: $I_H \geqq I_L + (2\times28) = I_L + (56)$. The relation for boundary 513 arises from the requirement that the minimum value for $I_{AC}$ is given by $(I_H-I_L)/2 \geqq 28$ mA. Bottom left boundary 514 is defined from the relation: $I_H \geqq -I_L-(2\times45) = -I_L-(90)$. The relation for boundary 514 arises from the initial assumption that the duty cycle is 50% and thus the minimum value for $I_{DC}$ is given by $(I_H+I_L)/2 \geqq -45$ mA.

The boundaries of polygon 520 are derived as follows. Top boundary 521 is defined from the relation: $I_{DC} \leqq -37$. Bottom boundary 523 is defined from the relation: $I_{DC} \geqq -45$. Right boundary 522 is defined from the relation: $I_{DC} \geqq I_L+28$. The relation for boundary 522 arises from the initial assumption that the duty cycle is 50% and thus the minimum value for $I_{AC}$ is given by $(I_H-I_L)/2 \geqq 28$ mA. Left boundary 524 is defined from the relation: $I_{DC} \leqq I_L/2$. The relation for boundary 524 arises from the initial assumption that the duty cycle is 50% and thus the maximum value for $I_H$ is given by $I_{DC}=(I_H+I_L)/2$, which combines with $I_H \leqq 0$ to give, $I_H=2(I_{DC})-I_L \leqq 0$.

Referring to the current-summing node 249 of FIG. 3C, it is seen that the sum of the magnitudes of $I_{MAJ}$ and $I_{MIN}$ will accurately define the bottom-most level, $I_L$, of the output current, $I_{OUT}$. The $I_H$ and $I_{DC}$ levels are set or biased to desired values by empirical adjustments to the dimensions of P345, P347, P349 and P245. These dimensions define how $I_{iref*}$ will be split into its respective fractional components, $I_{MIN}$ and $I_{MAJ}$.

FIG. 5 shows that picking a value of $I_L=-90$ mA is a bad idea because it leaves no tolerance for acceptable values of $I_H$ and $I_{DC}$. $I_H$ must be set precisely at zero and $I_{DC}$ must be set precisely at $-45$ mA.

On the other hand, if the value of $I_L$ is set in the range of approximately, $-73$ mA to $-74$ mA, relatively wide ranges of acceptable values for $I_H$ and $I_{DC}$ become possible. $I_H$ can be set within the relatively wide range of: $0>I_H>-17$ mA, and $I_{DC}$ can be set within the relatively wide range of: $-37>I_{DC}>45$ mA.

As one moves to the left or right of this maximum choice range, $I_L=73$ mA to $-74$ mA, the range of acceptable values for $I_H$ and $I_{DC}$ narrows.

The length of dashed line 574 (which line is drawn vertically down from point $-74,0$ to an intersection with boundary 514) represents the variance allowed for $I_H$ if $I_L$ is set at $-74$ mA. Similarly, the length of dashed line 573 represents the variance allowed for $I_H$ if $I_L$ is set at $-73$ mA. (Line 573 is constructed by first drawing a line vertically up from point $-73,-17$ to an intersection with boundary 512 and then shifting the drawn line up until its top end intersects the X axis.) Lines 573 and 574 are of equal length and the range of $I_L$ values between them ($-74$ mA$\leqq I_L \leqq -73$ mA) represents the region of maximum tolerance (100%) to variations in $I_H$ and $I_{DC}$.

Boundary line 514 can be viewed as graphing the amount of variance tolerance allowed for $I_H$, given a value for $I_L$ in the range $-90$ mA$\leqq$IL$\leqq -74$ mA. The value $I_L=-74$ mA gives maximum tolerance (100%) in this range and the value $I_L=-90$ mA gives minimum tolerance (0%) in this range.

Similarly, another line 572, drawn from the bottom end of line 573 to the $-65,0$ point, graphs the amount of variance tolerance allowed for $I_H$, given a value for $I_L$ in the range $-73$ mA$\leqq$IL$\leqq -65$ mA. The value $I_L=73$ mA gives maximum tolerance (100%) in this range and the value $I_L=-65$ mA gives minimum tolerance (0%) in this range.

Line 572 is twice as steep as line 514. The 50% variance tolerance range for $I_H$ is: $-82$ mA$\leqq$IL$\leqq -69$ mA. The 25% variance tolerance range for $I_H$ is: $-86$ mA$\leqq$IL$\leqq -67$ mA. The 10% variance tolerance range for $I_H$ is: $-88.4$ mA$\leqq$IL$\leqq -65.8$ mA.

A similar analysis can be applied to the $I_{DC}$ region of FIG. 5. It is to be understood that variance tolerance is but one of plural criteria to be considered in selecting values for $I_H$ and $I_L$. The other criteria include the consideration discussed above for picking $I_H$ so a relatively constant, large-signal transconductance, $G_m$, can be maintained for combined transistors N261–N276 and so that the small-signal transconductance, $g_m$, satisfies $2/g_m<R$. (See above equations Eq. 6 and Eq. 7.)

Additional considerations for selecting $I_H$ could include a pre-specified signal-to-noise ratios for the current signal $I_{OUT}$ injected into the communication cable and pre-specified power consumption values allowed for the circuitry of V/I:D/A unit 300.

The point of the above analysis is to show that selection of an $I_L$ value in the range $-74$ mA$\leqq I_L \leqq -73$ mA provides maximum flexibility for thereafter selecting a value for $I_H$. In practice, a value of $I_L$ in the range: $-73$ mA$\geqq I_L \geqq -85$ has been found to be acceptable. Once $I_L$ is picked, if there are no overriding criteria, $I_H$ is preferably set midway between the corresponding $I_L$ point on line 514 and the X axis so as to provide maximum leeway for variances in $I_H$ during mass production of the circuitry of V/I:D/A unit 300.

The reason why maximum leeway for variances in $I_H$ is desired for the CMOS embodiment 300 of FIGS. 3A–3C is because $I_H$ is only weakly correlated to the value of the reference currents, $I_{DRV}$, $I'_{DRV}$ and $I_1$ established by external resistor R31 and the reference voltage (e.g., 1.25V) developed across it. $I_L$ is more strongly correlated to the reference currents because the voltage conditions of the current mirroring circuits match substantially to one another when the condition $I_M=I_{MAJ}+I_{MIN}=I_{iref}$ is met. On the other hand, when $I_M=I_{MIN}$, the voltage conditions do not match and the value of $I_{out}$ is a function of how $I_M$ translates through filter stage 250 into a corresponding filter output voltage $V_F$ and how that particular value of $V_F$ is translated by N261–N276 into $I_H$. Mass production process variations can produce in relatively large variations of $I_H$ between one mass-produced V/I:D/A unit 300 and the next.

The above process for selecting $I_H$ and $I_L$ can be defined more generally as being a method for operating the waveshaping unit 300 to output a shaped signal $I_{OUT}$ having an alternating waveform with a predefined duty cycle, $T_{L/H}$ (e.g., equal to 0.50), a first level, $I_L$, defined as its maximum magnitude, a second level, $I_H$, defined as its minimum magnitude a third level, $I_{DC}$, defined as its average magnitude, and a fourth value, $I_{AC}$, defined as half its peak-to-peak magnitude, where the absolute values of said maximum, minimum and average levels satisfy the relations:

$$|I_L|>|I_{DC}|>|I_H|,$$

$$|I_L \cdot T_{L/H}+I_H \cdot (1-T_{L/H})|=|I_{DC}|, \text{ and}$$

$$|I_L|-|I_H|=2\cdot|I_{AC}|,$$

and where the absolute values of the maximum, minimum and average levels and half the peak-to-peak value need to satisfy the following predefined constraints:

$$I_{L1} \leqq |I_L| \leqq I_{L2},$$

$$I_{H1} \leqq |I_H| \leqq I_{H2},$$

$$I_{DC1} \leqq |I_{DC}| \leqq I_{DC2}, \text{ and}$$

$$I_{AC1} \leqq |I_{AC}|.$$

The method tries to assure that the predefined constraints will be satisfied even in the event that tolerable amounts of variance away from desired bias points will be experienced by one or both of the values of $I_H$ and $I_L$ for the shaped signal $IOU_T$ actually produced by the waveshaping unit 300. The method accordingly comprising the steps of:

(a) Defining, in a hypothetical two dimensional plane (FIG. 5) having $I_L$ and $I_H$ as its respective X and Y axes, a polygon 510 (or other enclosing figure) enclosing allowed operating values for $I_H$; where a first boundary [511] of the polygon defines the constraint, $I_{H1} \leqq |I_H|$, where a second boundary [512] of the polygon defines the constraint, $|I_L \cdot T_{L/H} + I_H \cdot (1 - T_{L/H})| = |I_{DC}| \geqq I_{DC1}$, where a third boundary [513] of the polygon defines the constraint, $|I_L| - |I_H| = 2 \cdot |I_{AC}| \geqq 2 \cdot I_{AC1}$, and where a fourth boundary [514] of the polygon defines the constraint, $$|I_L \cdot T_{L/H} + I_H \cdot (1 - T_{L/H})| = |I_{DC}| \leqq I_{DC2};$$

(b) Identifying within said polygon, one or more values of $I_L$ for which the allowed operating values of $I_H$ have maximum variance;

(c) Providing a reference current source and biasing the reference current source such that the $I_L$ value of the shaped signal $I_{OUT}$ output by the waveshaping unit [300] remains at or substantially near one of the identified values; and (d) Biasing the circuit such that the value of $I_H$ tends to a desired value within its maximum variance range in order to assure that $I_L$ and $I_H$ will remain within their allowed ranges even when one or both of the $I_L$ and $I_H$ of the shaped signal $I_{OUT}$ output by said waveshaping unit [300] vary by an insubstantial amount from their respective biased values. Of course, $I_H$ will be allowed maximum variance if it is biased to a level approximately midway in its maximum variance range, but there may be other circuit or system considerations which cause the design to use another bias value for $I_H$. During mass-production, a certain amount of variance away from the design-specified values will be tolerated for $I_H$ and $I_L$ because their design-specified values had been positioned well inside of polygon 510 and they can therefore shift somewhat while still remaining inside polygon 510.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A current generating apparatus comprising:

(a) a reference current source for generating a first reference current where the reference current source defines part of an upstream portion of the current generating apparatus;

(b) a first current-to-voltage (I/V) converter for converting the first reference current into a reference voltage;

(c) a first voltage-to-current (V/I) converter for converting the reference voltage into a second reference current;

(d) a voltage-operated switch for modulating the second reference current to produce therefrom a modulated current signal;

(e) a current-driven filter which receives the modulated current signal and produces therefrom a filtered voltage signal where the current-driven filter defines part of a downstream portion of the current generating apparatus;

(f) a second voltage-to-current (V/I) converter for converting the filtered output voltage signal of the filter into a filtered current and (g) a current multiplier for multiplying the magnitude of the filtered current output by the V/I converter to thereby produce an output current.

2. A current generating apparatus as recited in claim 1 wherein said current-driven filter introduces a filter-produced offset error into the filtered voltage signal and wherein said first voltage-to-current (V/I) converter introduces a precompensating offset error into the second reference current so as to cancel out, in the upstream portion of the current generating apparatus, the downstream effects of the filter-produced offset error on the filtered voltage signal.

3. A current generating apparatus as recited in claim 1 further comprising an integrated circuit chip wherein said first current-to-voltage (I/V) converter and said second voltage-to-current (V/I) converter are defined on said chip so as to have matched transform functions.

4. A current generating apparatus as recited in claim 1 further comprising an integrated circuit chip wherein said first voltage-to-current (V/I) converter and said voltage-operated switch are defined on said chip and the voltage-operated switch has a voltage-to-current (V/I) transform function matching that of said first voltage-to-current (V/I) converter.

5. A current generating apparatus as recited in claim 1 further comprising an integrated circuit chip wherein said current-driven filter and said first voltage-to-current (V/I) converter are defined on said chip and said current-driven filter introduces a filter-produced offset error into the filtered voltage signal and said first voltage-to-current (V/I) converter introduces a precompensating offset error into the second reference current which works to substantially cancel out the effects of the filter-produced offset error on the filtered voltage signal.

6. A current generating apparatus as recited in claim 1 further comprising an integrated circuit chip wherein said first current-to-voltage (I/V) converter and a portion of said reference current source are defined on said chip and said reference current source includes an off-chip reference magnitude setting means for setting the magnitude of the first reference current.

7. A current generating apparatus as recited in claim 6 wherein:

the output current has a maximum magnitude level a minimum magnitude level and an average magnitude level, said maximum, minimum and average magnitude levels of the output current need to satisfy a set of predefined boundary conditions, and said reference magnitude setting means sets the magnitude of the first reference current to a value which positions the minimum magnitude level of said output current such that a relatively wide range of allowable maximum magnitude levels, is made possible for said output current while still satisfying the predefined boundary conditions.

8. A current generating apparatus as recited in claim 1 wherein said reference current source includes a DC operational amplifier arranged in a negative feedback loop for a developing a precision reference voltage across a reference resistor and for thereby producing the flow of a scaled version of the first reference current through the reference resistor.

9. A current generating apparatus as recited in claim 1 wherein the voltage-operated switch includes a single-ended input-signal receiving means for modulating the second reference current in response to a single input voltage signal.

10. A current generating apparatus as recited in claim 9 further comprising duty-cycle adjusting means for receiving said single input voltage signal and producing therefrom a digital signal having a prespecified duty cycle.

11. A current generating apparatus as recited in claim 10 wherein said prespecified duty cycle is fifty percent.

12. A current generating apparatus as recited in claim 1 wherein said current-driven filter comprises:

a first filter resistor for conducting the modulated current signal, the first filter resistor having first and second ends;

a second filter resistor coupled to the first filter resistor, the second filter resistor having a first end coupled to the first end of the first filter resistor and a second end;

a field-effect filter transistor including a gate terminal, coupled to the second end of the second filter resistor, and a source terminal;

a first capacitor coupling the source terminal of said filter transistor to the first ends of the first and second filter resistors; and a second capacitor coupling the gate terminal of said filter transistor to ground;

wherein a voltage drop across the source and gate terminals of the filter transistor defines part or all of said filter-produced offset error.

13. A current generating apparatus as recited in claim 12 wherein said first voltage-to-current (V/I) converter includes an offset precompensating transistor which is matched to the filter transistor for developing a precompensating voltage drop matching the source-to-gate voltage drop across the source and gate terminals of the filter transistor.

14. A waveform shaping apparatus for shaping the waveform of an output current signal to comply with predefined ranges for maximum, minimum and average magnitude levels of the output current, and to comply with predefined spectral constraints on the magnitudes of frequency components of the output current, said apparatus comprising a sequential chain of signal transforming units for transforming a first reference current, provided at an upstream portion of the sequential chain, into said output current signal, wherein the sequential chain includes:

a filter unit provided at a relatively downstream portion of the sequential chain, the filter unit including offset-error introducing means which introduces an undesirable offset-error component into a filtered signal produced therein; and an offset pre-compensating unit, positioned in said sequential chain upstream of the filter unit, for introducing a pre-compensating offset component into a second reference signal produced therein, where the second reference signal is derived from the first reference current and the pre-compensating offset component functions to substantially cancel out the error introduced into filtered signal by the offset-error component.

15. A waveform shaping apparatus according to claim 14 wherein the offset-error introducing means of the filter unit includes a first transistor and the offset pre-compensating unit includes a matched second transistor.

16. A waveform shaping apparatus according to claim 15 wherein the first and second transistors are defined within an integrated circuit.

17. A current generating method comprising the steps of:

(a) switching a current modulator between conductive and nonconductive states;

(b) passing a first reference current of a prescribed magnitude through the current modulator when the current modulator is in a conductive state;

(c) combining the current, if any, which is passed through the current modulator with a second reference current to thereby produce a modulated current;

(d) producing an output current from the modulated current; and (e) setting the combined magnitudes of said first and second reference current such that the modulated current will be well within a predefined set of boundary conditions to be satisfied by maximum, minimum and average magnitude levels of the output current, even if the second reference current drifts by a tolerable amount from its prescribed magnitude.

18. A current generating method according to claim 17 wherein:

said predefined set of boundary conditions includes a constraint on the duty cycle at which said current modulator is to be switched, said predefined set of boundary conditions is represented by a quadrilateral drawn on a plane having the maximum allowed absolute magnitude level, $|I_L|$, for said output current as its X axis and the minimum allowed absolute magnitude level, $|I_H|$, for said output current as its Y axis, corner points of said quadrilateral are defined in terms of absolute milliampere values in (X,Y) coordinate format as: (90,0), (74,0), (65,0) and (73,17); and the combined magnitudes of said first and second reference current is set such that:

$$65.8 \text{ mA} \leq |I_L| \leq 88.4 \text{ mA}.$$

19. A current generating method according to claim 18 wherein:

the combined magnitudes of said first and second reference current is set such that:

$$67 \text{ mA} \leq |I_L| < 86 \text{ mA}.$$

20. A current generating method according to claim 19 wherein:

the combined magnitudes of said first and second reference current is set such that:

$$69\text{ mA} \leqq |I_L| \leqq 82\text{ mA}.$$

21. A current generating method according to claim 20 wherein:

the combined magnitudes of said first and second reference current is set such that :

$$73\text{ mA} \leqq |I_L| \leqq 74\text{ mA}.$$

22. A method for operating a waveshaping unit to output a shaped signal $I_{OUT}$ having an alternating waveform with a predefined duty cycle, $T_{L/H}$, a first level, $I_L$, defined as its maximum magnitude, a second level, $I_H$, defined as its minimum magnitude a third level, $I_{DC}$, defined as its average magnitude, and a fourth value, $I_{AC}$, defined as half its peak-to-peak magnitude, where the absolute values of said maximum, minimum and average levels satisfy the relations:

$$|I_L| < |I_{DC}| < |I_H|,$$

$$|I_L \cdot T_{L/H} + I_H \cdot (1 - T_{L/H})| = |I_{DC}|,$$

and $$|I_L| - |I_H| = 2 \cdot |I_{AC}|,$$

and where the absolute values of said maximum, minimum and average levels and half the peak-to-peak value need to satisfy the following predefined constraints:

$$I_{L1} \leqq |I_L| \leqq I_{L2},$$

$$I_{H1} \leqq |I_H| \leqq I_{H2},$$

$$I_{DC1} \leqq |I_{DC}| \leqq I_{DC2},$$

and $$I_{AC1} \leqq |I_{AC}|,$$

said method being for the purpose of assuring that the predefined constraints will be satisfied even in the event that a tolerable amount of variance is experienced by the value of $I_H$ for the shaped signal $I_{OUT}$ actually produced by said waveshaping unit, the method comprising the steps of:

(a) defining, in a hypothetical two dimensional plane having $I_L$ and $I_H$ as its respective X and Y axes, a polygon enclosing allowed operating values for $I_H$;

(b) identifying within said polygon, one or more values of $I_L$ for which the allowed operating values of $I_H$ have maximum variance;

(c) providing a reference means for defining the $I_L$ value of the shaped signal $I_{OUT}$ output by said waveshaping unit; and (d) biasing the reference means such that the $I_L$ value of the shaped signal $I_{OUT}$ will remain at or substantially near one of the identified values.

23. A method for operating a waveshaping unit in accordance with claim 22 further comprising the steps of:

providing establishing means for establishing the $I_H$ value of the shaped signal $I_{OUT}$ output by said waveshaping unit; and adjusting the establishing means such that $I_H$ is biased to a desired value within its maximum variance range in order to assure that $I_L$ and $I_H$ will remain within their allowed ranges even when one or both of the $I_L$ and $I_H$ of the shaped signal $I_{OUT}$ output by said waveshaping unit vary by an allowable amount from their respective biased values.

24. A method for operating a waveshaping unit in accordance with claim 22:

where a first boundary of said polygon defines the constraint, $I_{H1} \leqq |I_H|$, where a second boundary of said polygon defines the constraint, $$|I_L \cdot T_{L/H} + I_H \cdot (1 - T_{L/H})| = |I_{DC}| \geqq I_{DC1},$$

where a third boundary of said polygon defines the constraint, $$|I_L| - |I_H| = 2 \cdot |I_{AC}| \geqq 2 \cdot I_{AC1}, \text{ and}$$

where a fourth boundary of said polygon defines the constraint, $$|I_L \cdot T_{L/H} + I_H \cdot (1 - T_{L/H})| = |I_{DC}| \leqq I_{DC2}.$$

25. A method for operating a waveshaping unit in accordance with claim 22 where the biasing of $I_H$ to a desired value within its maximum variance range includes biasing it to a point approximately midway in within its maximum variance range.

26. A method for operating a waveshaping unit in accordance with claim 22 where the allowable variance for $I_H$ from its bias value is ten percent or more of the identified maximum variance for $I_H$.

27. A method for operating a waveshaping unit in accordance with claim 22 where the allowable variance for $I_H$ from its bias value is twenty-five percent or more of the identified maximum variance for $I_H$.

28. A method for operating a waveshaping unit in accordance with claim 22 where the allowable variance for $I_H$ from its bias value is fifty percent or more of the identified maximum variance for $I_H$.

29. A method for operating a waveshaping unit in accordance with claim 22 where the shaped output signal $I_{OUT}$ is an output current.

30. A method for operating a waveshaping unit in accordance with claim 29 further comprising the step of:

injecting the shaped output current $I_{OUT}$ into a communications cable.

31. A method for operating a waveshaping unit in accordance with claim 22 wherein said step (c) of providing a reference means for defining the $I_L$ value includes the steps of:

(c.1) providing a first transistor through which a first subdivision of a merged current signal flows;

(c.2) providing a process-matched second transistor through which a second subdivision of the merged current signal flows;

(c.3) selectively combining the first and second subdivisions to thereby define the merged current signal, the value of $I_L$ being defined by the combination of first and second subdivisions;

(c.4) providing a process-matched third transistor through which a reference drive current flows, the third transistor being coupled by a current-mirroring means to the first and second transistors such that substantially similar voltage conditions exist across the first through third transistors when the first and second subdivisions are combined to define the merged current signal; and (c.5) providing reference resistor through which a current-mirrored replica of the reference drive current flows; and wherein said step (d) of biasing includes the step of:

(d.1) setting the value of the reference resistor such that the $I_L$ value of the shaped signal $I_{OUT}$ will remain at or substantially near one of the identified values.

32. In the mass production of plural waveshaping units each outputting an oscillating signal $I_{OUT}$ having first and second levels, $I_L$ and $I_H$, defining minimum and maximum magnitudes of the oscillating output signal $I_{OUT}$, where a waveshape of the oscillating output signal $I_{OUT}$ is to be confined to predefined, allowable ranges of operation, and where the allowable ranges of operation define in a hypothetical plane having $I_L$ and $I_H$ as its X and Y axes, a bound region of allowable operation, the predefined, allowable ranges of operation being such that the extent of the bound region in the direction of a second of the X and Y axes varies as a function of position along a first of the X and Y axes, a method for urging the operation of each of the plural waveshaping units into the predefined, allowable ranges of operation, the method comprising the steps of:

(a) finding in the hypothetical plane, one or more positions along the first of the X and Y axes, for which the extent of the bound region in the direction of the second of the X and Y axes is relatively maximal;

(b) providing an settable value defining means for urging the value of the one of the first and second levels, $I_L$ and $I_H$, that corresponds to the first of the X and Y axes, to a settable value; and (c) setting the value defining means to urge the value of the one of the first and second levels, $I_L$ and $I_H$, to one of the found values along the first of the X and Y axes, for which the extent of the bound region in the direction of the second of the X and Y axes is relatively maximal.

33. A current generating apparatus having upstream and downstream portions through which a succession of signals flow, the current generating apparatus comprising:

(a) modulating means for modulating a supplied reference current to produce therefrom a modulated current signal;

(b) a current-driven filter which receives the modulated current signal and produces therefrom a filtered voltage signal; and (c) a voltage-to-current (V/I) converter for converting the filtered output voltage signal of the filter into a filtered current.

34. A current generating apparatus as recited in claim 33 further comprising:

(d) a second voltage-to-current (V/I) converter for converting a supplied reference voltage into said reference current and supplying the reference current to the modulating means;

wherein said current-driven filter introduces a filter-produced offset error into the filtered voltage signal, and wherein said second voltage-to-current (V/I) converter introduces a precompensating offset error into the second reference current so as to cancel out, in the corresponding upstream portion of the current generating apparatus, the downstream effects of the filter-produced offset error on the filtered voltage signal.

35. A current generating method comprising the steps of:

(a) generating a reference current;

(b) modulating the reference current to produce therefrom a modulated current signal;

(c) filtering the modulated current signal with a current-driven filter that responsively produces a filtered output signal, wherein the filter introduces a filter-produced offset error into the filtered output signal; and (d) prior to said step (c) of filtering, introducing a precompensating offset error into the reference current, the precompensating offset error being such that it substantially cancels out the later-introduced effects of the filter-produced offset error.

* * * * *

UNITED STATES PATENT AND TRADEMARK OFFICE
CERTIFICATE OF CORRECTION

PATENT NO. : 5,367,248

DATED : November 22, 1994

INVENTOR(S) : San L. Lin

It is certified that error appears in the above-identified patent and that said Letters Patent is hereby corrected as shown below:

Column 4, line 50, after "current" change "15" to --$I_5$--.
Column 9, line 38, change "±5V" to --+5V--.
Column 20, line 63, after "level" and before "a" insert a comma (,).
Column 23, line 25 should read --$|I_L| > |I_{DC}| > |I_H|$ ,--.

Signed and Sealed this

Twenty-third Day of May, 1995

Attest:

Bruce Lehman

BRUCE LEHMAN

*Attesting Officer* *Commissioner of Patents and Trademarks*